(12) United States Patent
Hashimoto

(10) Patent No.: US 11,264,549 B2
(45) Date of Patent: Mar. 1, 2022

(54) METHOD FOR PRODUCING LIGHT EMITTING DEVICE, AND LIGHT EMITTING DEVICE

(71) Applicant: NICHIA CORPORATION, Anan (JP)

(72) Inventor: Toru Hashimoto, Tokushima (JP)

(73) Assignee: NICHIA CORPORATION, Anan (JP)

( * ) Notice: Subject to any disclaimer, the term of this patent is extended or adjusted under 35 U.S.C. 154(b) by 61 days.

(21) Appl. No.: 16/527,598

(22) Filed: Jul. 31, 2019

(65) Prior Publication Data

US 2020/0044129 A1  Feb. 6, 2020

(30) Foreign Application Priority Data

Aug. 2, 2018  (JP) .............................. JP2018-145530

(51) Int. Cl.
*H01L 33/62* (2010.01)
*H01L 33/36* (2010.01)
*H01L 25/075* (2006.01)

(52) U.S. Cl.
CPC .......... *H01L 33/62* (2013.01); *H01L 25/0753* (2013.01); *H01L 33/36* (2013.01); *H01L 2933/0066* (2013.01)

(58) Field of Classification Search
None
See application file for complete search history.

(56) References Cited

U.S. PATENT DOCUMENTS

2007/0235218 A1  10/2007  Miyamoto et al.
2011/0241061 A1  10/2011  Yu et al.
2012/0302124 A1*  11/2012  Imazu .................. H01L 33/486
　　　　　　　　　　　　　　　　　　　　　　445/58
2014/0048821 A1  2/2014  Inoue et al.
2015/0050760 A1  2/2015  Imazu et al.
2015/0061102 A1*  3/2015  Lin .................. H01L 21/76898
　　　　　　　　　　　　　　　　　　　　　　257/692
2015/0340327 A1*  11/2015  Uzoh ...................... H01L 24/48
　　　　　　　　　　　　　　　　　　　　　　257/723

(Continued)

FOREIGN PATENT DOCUMENTS

JP  2003264359 A  9/2003
JP  2004207542 A  7/2004

(Continued)

*Primary Examiner* — Nduka E Ojeh
(74) *Attorney, Agent, or Firm* — Hunton Andrews Kurth LLP

(57) ABSTRACT

Provided is a method for producing a light emitting device, including the steps of providing an intermediate body including a precursor substrate including a base member that includes a top surface and a first bottom surface, a pair of first wiring portions on the top surface, and a pair of second wiring portions electrically connected with the pair of first wiring portions respectively and positioned between the top surface and the first bottom surface; and a light emitting element on the first wiring portions; removing a part of the base member off the first bottom surface of the base member to thin the base member so that a second bottom surface of the base member is formed; and forming a pair of external electrodes, to be electrically connected with the pair of second wiring portions respectively, on the second bottom surface.

13 Claims, 16 Drawing Sheets

(56) References Cited

U.S. PATENT DOCUMENTS

| | | | |
|---|---|---|---|
| 2015/0367602 A1* | 12/2015 | Iwaya | B32B 27/08 |
| | | | 428/522 |
| 2016/0300825 A1 | 10/2016 | Hoeppel | |
| 2017/0256496 A1* | 9/2017 | Lin | H01L 21/4853 |
| 2018/0323352 A1* | 11/2018 | Takano | H01L 33/502 |

FOREIGN PATENT DOCUMENTS

| | | | |
|---|---|---|---|
| JP | 2005166909 A | 6/2005 | |
| JP | 2007281301 A | 10/2007 | |
| JP | 2011222993 A | 11/2011 | |
| JP | 2013045943 A | 3/2013 | |
| JP | 2014067934 A | 4/2014 | |
| JP | 2014120635 A | 6/2014 | |
| JP | 2015201665 A | 11/2015 | |
| JP | 2016122868 A | 7/2016 | |
| JP | 2016533044 A | 10/2016 | |
| JP | 2017163130 A | 9/2017 | |
| JP | 2018107258 A | 7/2018 | |
| WO | 2013/111542 A1 | 8/2013 | |
| WO | 2013137356 A1 | 9/2013 | |

* cited by examiner

FIG.9
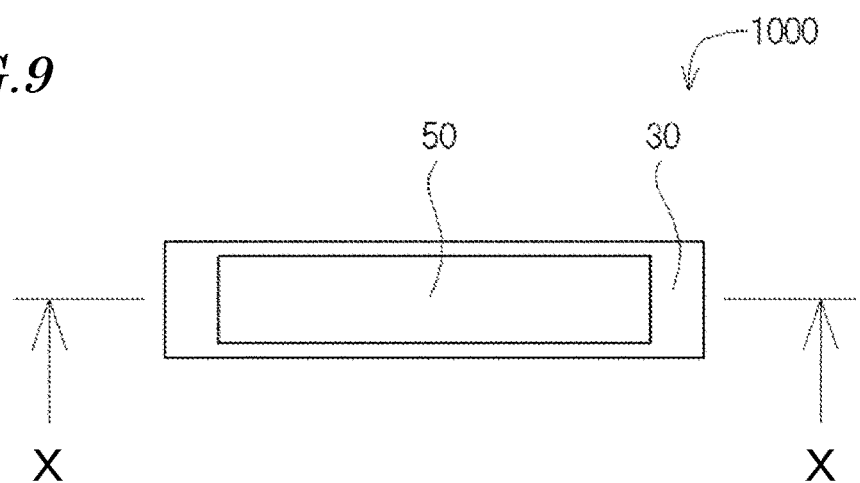
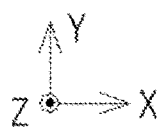
FIG.10
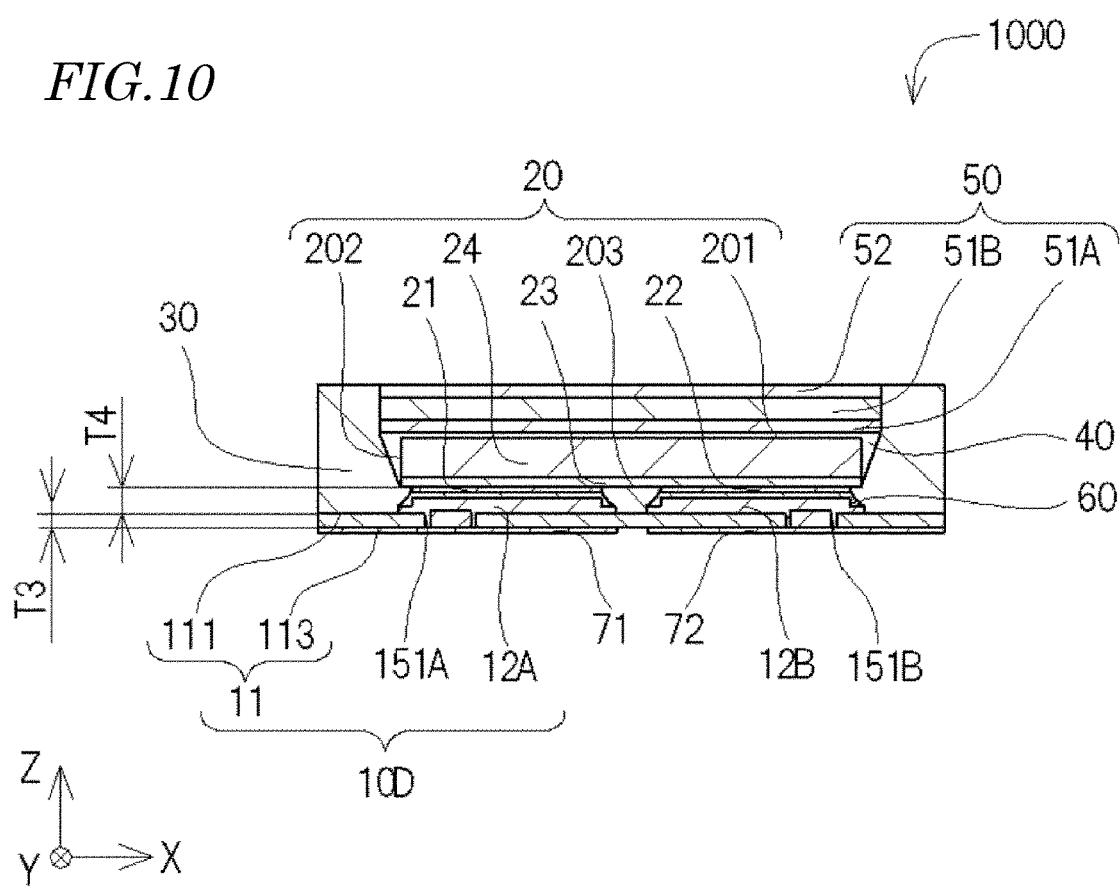

METHOD FOR PRODUCING LIGHT EMITTING DEVICE, AND LIGHT EMITTING DEVICE

CROSS REFERENCE TO RELATED APPLICATION

This application claims priority to Japanese Patent Application No. 2018-145530, filed on Aug. 2, 2018, the disclosure of which is hereby incorporated by reference in its entirety.

BACKGROUND

The present disclosure relates to a method for producing a light emitting device, and a light emitting device.

Light emitting elements (e.g., LED elements) are in wide use in various applications including light sources for backlight units, various lighting devices and the like. Japanese Patent Publication No. 2004-207542 discloses a compact light emitting device including a package having a recess, and a light emitting element, the light emitting element placed in the recess.

SUMMARY

There is a demand for a thinner light emitting device in order to reduce the size of a product including a light emitting device.

In certain general aspect, a method for producing a light emitting device according to the present disclosure includes the steps of providing an intermediate body including a precursor substrate including a base member that includes a top surface and a first bottom surface positioned opposite to the top surface, a pair of first wiring portions located on the top surface, and a pair of second wiring portions electrically connected with the pair of first wiring portions respectively and positioned between the top surface and the first bottom surface; and a light emitting element located on the first wiring portions; removing a part of the base member off the first bottom surface of the base member to thin the base member so that a second bottom surface of the base member is formed; and forming a pair of external electrodes, to be electrically connected with the pair of second wiring portions respectively, on the second bottom surface.

In another general aspect, a light emitting device according to the present disclosure includes a substrate including a base member that includes a top surface and a second bottom surface positioned opposite to the top surface, a pair of first wiring portions located on the top surface, a pair of external electrodes located on the second bottom surface, and a pair of second wiring portions electrically connected with the pair of first wiring portions respectively and also with the pair of external electrodes respectively; and a light emitting element including a light extraction surface, an electrodes formation surface opposite to the light extraction surface, lateral surfaces between the light extraction surface and the electrodes formation surface, and a pair of element electrodes on the electrodes formation surface, the light emitting element being located on the first wiring portions with the pair of element electrodes facing the pair of first wiring portions. A maximum thickness of the base member is at least 0.3 times and at most 4 times a maximum distance from the electrodes formation surface to the top surface of the base member.

According to a certain embodiment of the present disclosure, it is possible to provide a thin light emitting device.

BRIEF DESCRIPTION OF THE DRAWINGS

FIG. 9 is a schematic plan view of the light emitting device according to embodiment 1.
FIG. 10 is a schematic cross-sectional view taken along line X-X in FIG. 9.

DETAILED DESCRIPTION

Figure 1:
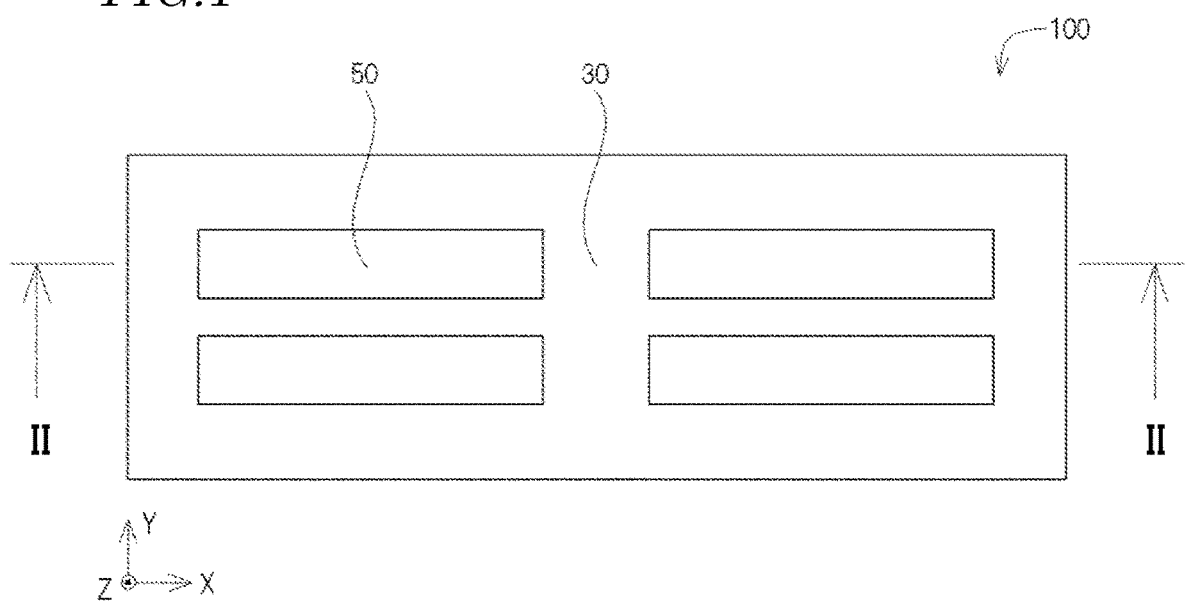
FIG. 1 is a schematic plan view of an intermediate body according to embodiment 1.

Hereinafter, embodiments of the present disclosure will be described with reference to the attached drawings. Light emitting devices described below embody the technological idea of the present disclosure, and the present disclosure is not limited to any of the following embodiments unless otherwise specified. A content described in one embodiment is applicable to other embodiments and modifications. In the drawings, the size, positional arrangement or the like may be emphasized for clear illustration.

Embodiment 1

Figure 2:
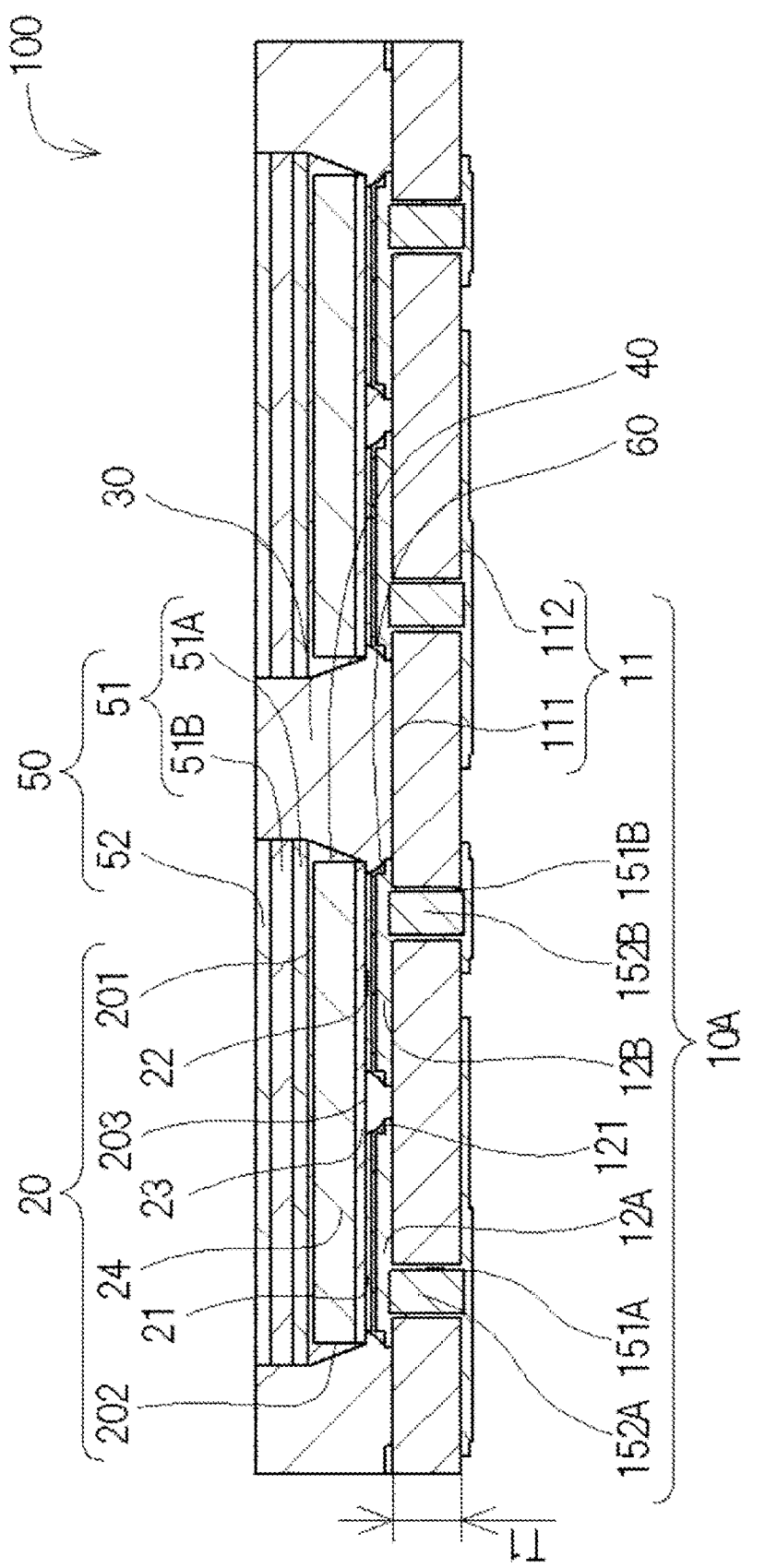
FIG. 2 is a schematic cross-sectional view taken along line II-II in FIG. 1.
Figure 3:
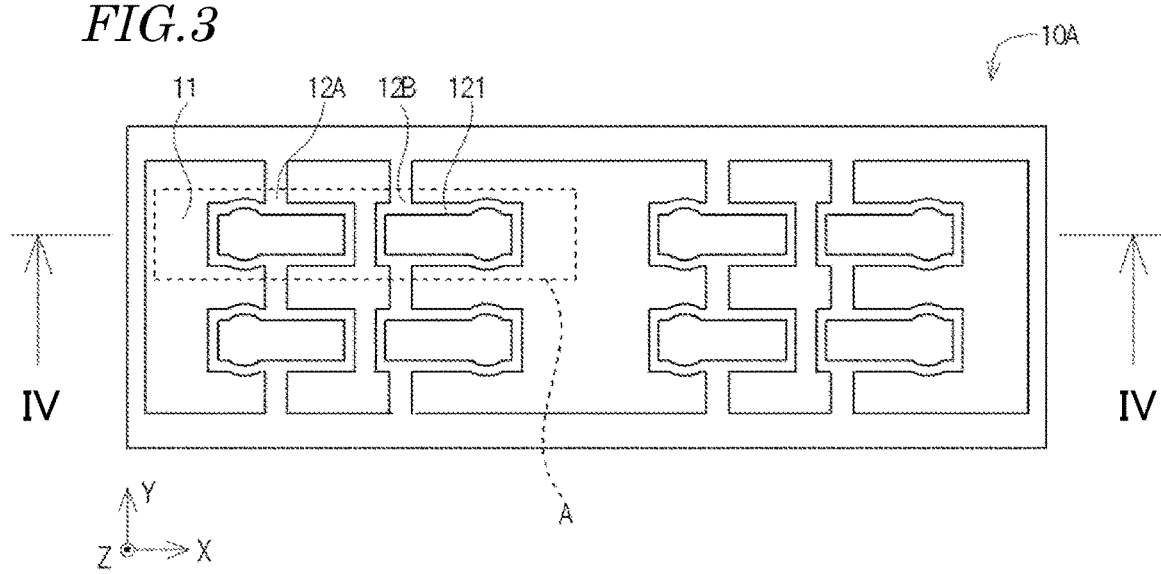
FIG. 3 is a schematic plan view of a precursor substrate according to embodiment 1.
Figure 4:
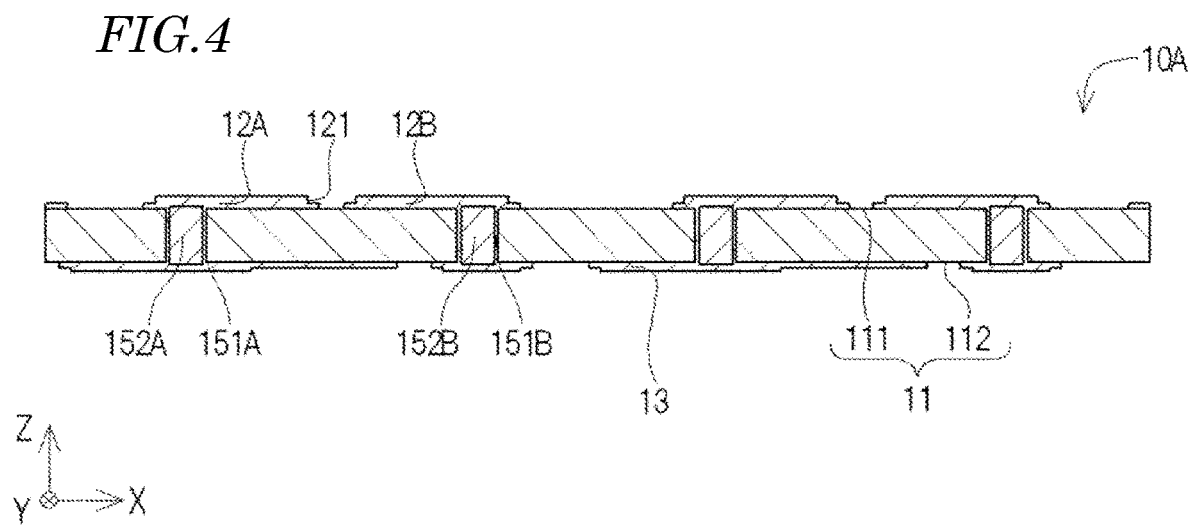
FIG. 4 is a schematic cross-sectional view taken along line IV-IV in FIG. 3.

A method for producing a light emitting device according to embodiment 1 of the present disclosure will be described with reference to FIG. 1 through FIG. 8. FIG. 1 is a plan view of an intermediate body according to embodiment 1. FIG. 2 is a schematic cross-sectional view taken along line II-II in FIG. 1. FIG. 3 is a plan view of a precursor substrate according to embodiment 1. FIG. 4 is a schematic cross-sectional view taken along line IV-IV in FIG. 3. FIG. 5 through FIG. 8 are each a schematic cross-sectional view showing a step in a method for producing the light emitting device according to embodiment 1.

The method for producing the light emitting device according to embodiment 1 includes the steps of:

(1) providing an intermediate body including:

a precursor substrate including a base member that includes a top surface and a first bottom surface positioned opposite to the top surface, a pair of first wiring portions located on the top surface, and a pair of second wiring portions electrically connected with the pair of first wiring portions respectively and positioned between the top surface and the first bottom surface; and a light emitting element located on the first wiring portions;

(2) removing a part of the base member from the side of the first bottom surface of the base member to thin the base member, and to form a second bottom surface of the base member; and (3) forming a pair of external electrodes, to be electrically connected with the pair of second wiring portions respectively, on the second bottom surface.

According to the above-described method for producing the light emitting device in an embodiment, a part of the base member is removed to thin the base member, thereby forming the second bottom surface of the base member. Therefore, a thin light emitting device can be produced. Hereinafter, each of the steps will be described in detail.

(Step of Providing an Intermediate Body)

As shown in FIG. 2, an intermediate body 100 including a precursor substrate 10A and a light emitting element 20 is provided. The precursor substrate 10A includes a base member 11, a pair of first wiring portions 12A and 12B, and a pair of second wiring portions 151A and 151B. In this specification, a substrate in a state before a part of the base member 11 is removed may be referred to as a "precursor substrate". A substrate in a state after the part of the base member 11 is removed but before external electrodes are formed may be referred to as a "post-removal substrate". A substrate in a state after the external electrodes are formed but before the step of division into individual portions (described below) may be referred to as an "external electrodes-attached substrate". After the step of division into individual portions, each individual portion of the "external electrodes-attached substrate" obtained by such a singulation may be referred to as an "individual substrate". The precursor substrate, the post-removal substrate, the individual substrate and/or the external electrodes-attached substrate may be referred to as a "substrate".

The base member 11 includes a top surface 111 and a first bottom surface 112 positioned opposite to the top surface 111. The pair of first wiring portions 12A and 12B are located on the top surface 111 of the base member 11. The pair of first wiring portions 12A and 12B respectively serves as a positive electrode and a negative electrode. In other words, each individual substrate includes the pair of first wiring portions 12A and 12B separate from each other so as to serve as a pair of electrodes, i.e., a positive electrode and a negative electrode.

In the precursor substrate 10A, plural pairs of first wiring portions 12A and 12B may be separate from each other, or may be continuous to each other. As shown in FIG. 3, it is sufficient that the precursor substrate 10A includes a portion that is to become a pair of first wiring portions separate from each other so as to become a positive electrode and a negative electrode in each of areas A, which are to become individual substrates. In this specification, as long as the precursor substrate 10A includes a portion that is to become the pair of first wiring portions 12A and 12B separate from each other in each of the areas A, which are to become individual substrates, the precursor substrate 10A is described as including the pair of first wiring portions 12A and 12B.

It is preferable that a maximum thickness T1 from the top surface 111 to the first bottom surface 112 in a Z direction is 100 µm or greater and 500 µm or less. The "maximum thickness from the top surface 111 to the first bottom surface 112 in the Z direction" is the maximum thickness of the base member 11 of the precursor substrate 10A. The structure in which the thickness from the top surface 111 to the first bottom surface 112 is 100 µm or greater improves the strength of the base member 11. The structure in which the thickness from the top surface 111 to the first bottom surface 112 in the Z direction is 500 µm or less, the volume of the base member 11 that is removed in the step of removing a part of the base member 11 (described below) can be decreased.

The second wiring portions 151A and 151B are electrically connected with the first wiring portions 12A and 12B respectively. For example, as shown in FIG. 2, one of the pair of second wiring portions, e.g., the second wiring portion 151A, and one of the pair of first wiring portions, e.g., the first wiring portion 12A, are electrically connected with each other; and the other of the pair of second wiring portions, e.g., the second wiring portion 151B, and the other of the pair of first wiring portions, e.g., the first wiring portion 12B, are electrically connected with each other. The second wiring portions 151A and 151B are positioned between the top surface 111 of the base member 11 and the first bottom surface 112 of the base member 11. In this specification, the "second wiring portions 151A and 151B" refer to portions of wiring that are positioned between the top surface 111 of the base member 11 and the first bottom surface 112 of the base member 11. The second wiring portions 151A and 151B may be formed from the top surface 111 of the base member 11 to the first bottom surface 112 of the base member 11, or may be separate from the first bottom surface 112 of the base member 11.

As shown in FIG. 4, the second wiring portions 151A and 151B may be respectively formed in through-holes running from the top surface 111 of the base member 11 to the first bottom surface 112 of the base member 11. For example, as shown in FIG. 4, the second wiring portions 151A and 151B may be respectively formed on walls of the through-holes running through the base member 11, and the precursor substrate 10A may include filling members 152A and 152B respectively in regions enclosed by the second wiring portions 151A and 151B.

The filling members 152A and 152B may be conductive or insulating. It is preferable that the filling members 152A and 152B comprise or are formed of a resin material. In the case where the filling members 152A and 152B comprise or are formed of a metal material, electricity can be supplied through the filling members 152A and 152B to the light emitting element 20, in addition to the second wiring portions 151A and 151B.

In general, a pre-cured resin material has a higher fluidity than that of a pre-cured metal material, and thus easily fills the regions enclosed by the second wiring portions 151A and 151B. Therefore, use of a resin material for the filling members 152A and 152B makes it easy to produce the precursor substrate 10A. Examples of the resin material that easily fills such regions include an epoxy resin. In the case where a resin material is used for the filling members 152A and 152B, the resin material may contain an additive. With such a structure, the coefficient of linear thermal expansion of the filling members 152A and 152B may be decreased. This can decrease the difference in the coefficient of linear thermal expansion between the filling members 152A and 152B and the second wiring portions 151A and 151B, and therefore, can alleviate generation of a gap between the second wiring portions 151A and 151B and the filling members 152A and 152B due to heat from the light emitting element 20. Examples of the additive include silicon oxide. In the case where a metal material having a high heat conductivity such as Ag, Cu or the like is used for the filling members 152A and 152B, the heat dissipation property of the light emitting device can be improved.

In each of the regions A, which are to become the individual substrates, the second wiring portions 151A and 151B may be formed on an outer lateral surface of the base member 11. In the case where the top surface 111 of the base member 11 in each region A, which is to become an individual substrate, is rectangular, the second wiring portions 151A and 151B may be formed on a longer lateral surface and/or a shorter lateral surface. In the case where the base member 11 has at least one recessed portion in the top surface 111, the second wiring portions 151A and 151B may each be formed in the corresponding one of the recessed portions of the base member 11. The second wiring portions 151A and 151B may be formed in the through-holes of the base member 11, on the outer lateral surface and/or in the recessed portion.

The intermediate body 100 includes at least one light emitting element 20. The light emitting element 20 is located on the first wiring portions 12A and 12B. Alternatively, as shown in FIG. 2, the intermediate body 100 may include a plurality of light emitting elements 20. The following description regarding the structure of the light emitting elements 20 will be made on one light emitting element 20 for the sake of simplicity.

As shown in FIG. 2, the light emitting element 20 includes the electrodes formation surface 203 facing the precursor substrate 10A and a light extraction surface 201 positioned opposite to the electrodes formation surface 203. The light emitting element 20 includes at least a semiconductor stack body 23. The light emitting element 20 includes an element substrate 24 in this embodiment, but does not need include the element substrate 24.

The semiconductor stack body 23 includes element electrodes 21 and 22. The element electrodes 21 and 22 are formed on the same surface of the light emitting element 20. In this example, the element electrodes 21 and 22 are formed on an electrodes formation surface 203, which is a surface opposite to the light extraction surface 201. With such an arrangement, the light emitting element 20 can be mounted on the precursor substrate 10A by way of flip-chip bonding. In the case where the light emitting element 20 is flip-chip-mounted on the precursor substrate 10A, the element electrodes 21 and 22 of the light emitting element 20 are electrically connected with the first wiring portions 12A and 12B respectively via a conductive bonding member 60. This makes it unnecessary to provide a wire that supplies electricity to the element electrodes 21 and 22 of the light emitting element 20, and thus can reduce the size of the light emitting device. In the case where the light emitting element 20 is flip-chip-mounted, a surface opposite to an electrodes formation surface 203, on which the element electrodes 21 and 22 of the light emitting element 20 are positioned, serves as the light extraction surface 201.

In the case where the light emitting element 20 is flip-chip-mounted on the precursor substrate 10A, the first wiring portions 12A and 12B may each include protrusion 121 at positions overlapping the element electrodes 21 and 22 of the light emitting element 20 as seen in a plan view. In the case where the conductive bonding member 60 is formed of a meltable adhesive, during a work of connecting the protrusions 121 of the first wiring portions 12A and 12B and the element electrodes 21 and 22 of the light emitting element 20 with each other respectively, the positional alignment between the light emitting element 20 and the precursor substrate 10A can be easily realized by a self-alignment effect.

Alternatively, the light emitting element 20 may be located on the first wiring portions 12A and 12B with the surface opposite to the electrodes formation surface facing the precursor substrate 10A. In this case, the electrodes formation surface serves as the light extraction surface. In such a configuration, a wire or the like may be used in order to supply electricity to the element electrodes 21 and 22 of the light emitting element 20.

The intermediate body 100 may include a first reflective member 30 covering lateral surfaces 202 of the light emitting element 20 and the top surface 111 of the base member 111. The structure in which the lateral surfaces 202 of the light emitting element 20 are covered with the first reflective member 30 improves the contrast between a light emitting region and a non-light emitting region. Therefore, the light emitting device can have a highly clear border between the light emitting region and the non-light emitting region. In the case where the intermediate body 100 includes a plurality of light emitting elements 20, a plurality of first reflective members 30 respectively covering the plurality of light emitting elements 20 may be formed, or as shown in FIG. 1, one first reflective member 30 integrally covering all the plurality of light emitting element 20 may be formed. The first reflective member 30 integrally covering all the plurality of light emitting element 20 is preferable because a light emitting device including such one first reflective member 30 is produced more easily than a light emitting device including the plurality of first reflective members 30 respectively covering the plurality of light emitting elements 20.

The first reflective member 30 may comprise or be formed of, for example, a material containing a white pigment in a base material thereof. It is preferable that the base material of the first reflective member 30 comprises or is formed of a resin, for example, a silicone resin, an epoxy resin, a phenol resin, a polycarbonate resin, an acrylic resin or a modified resin thereof. An epoxy resin is especially preferable as the base material of the first reflective member 30 because use of an epoxy resin improves the hardness of the light emitting device than use of a silicone resin. A silicone resin and a modified resin thereof, which are highly resistant against heat and light, are also preferable as the base material of the first reflective member 30.

The white pigment of the first reflective member 30 may comprise or be formed of a single material or a combination of two or more materials among, for example, titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, silicon oxide, and the like. The white pigment may have an appropriate shape, and may be irregular or crushed. It is preferable that the white pigment is spherical from the point of view of the fluidity. It is preferable that the white pigment has an average particle size of, for example, about 0.1 µm or more and about 0.5 µm or less. It is preferable that the particle size of the white pigment is as short as possible in order to improve the effects of light reflection and covering. The content of the white pigment in the first reflective member 30 may be of any appropriate value, and is, for example, preferably 10 wt. % or higher and 80 wt. % or lower, more preferably 20 wt. % or higher and 70 wt. % or lower, and still more preferably 30 wt. % or higher and 60 wt. % or lower, from the points of view of the light reflectance, the viscosity in a liquid state and the like. The term "wt. %" herein refers to percent by weight, and represents the weight ratio of a material of interest with respect to the total weight of the first reflective member 30.

The intermediate body 100 may include a light-transmissive member 50 covering the light extraction surface 201 of the light emitting element 20. The light-transmissive member 50 covers the light emitting element 20, and thus protects the light emitting element 20 against an external stress. In the light emitting device according to embodiment 1, the light-transmissive member 50 serves as a light emitting surface of the light emitting device. The light-transmissive member 50 may cover, while being in contact with, the light extraction surface 201, or as shown in FIG. 2, may cover the first light extraction surface 201 via a first light guide member 40.

The first light guide member 40 may be positioned only between the light extraction surface 201 of the light emitting element 20 and the light-transmissive member 50 to secure the light emitting element 20 and the light-transmissive member 50, or may cover the light extraction surface 201 of the light emitting element 20 and also the lateral surfaces 202 of the light emitting element 20 to secure the light emitting element 20 and the light-transmissive member 50. The first light guide member 40 transmits light from the light emitting element 20 at a higher transmittance than the first reflective member 30. Therefore, with the structure in which the first light guide member 40 covers the lateral surfaces 202 of the light emitting element 20 as well as the light extraction surface 201, light emitted from the lateral surfaces 202 of the light emitting element 20 is more likely to be extracted to the outside of the light emitting device via the first light guide member 40. This can improve the light extraction efficiency.

In the case where the intermediate body 100 includes the light-transmissive member 50, it is preferable that lateral surfaces of the light-transmissive member 50 are covered with the first reflective member 30. With such a structure, the light emitting device can have a high contrast between a light emitting region and a non-light emitting region, namely, can have a highly clear border between the light emitting region and the non-light emitting region.

The light-transmissive member 50 may contain wavelength conversion particles. This allows adjustment of emission color of the light emitting device to be performed easily. The wavelength conversion particles absorb at least a part of primary light emitted by the light emitting element 20 and emit secondary light having a wavelength different from that of the primary light. The structure in which the light-transmissive member 50 contains the wavelength conversion particles can output mixed light including a mixture of the primary light emitted by the light emitting element 20 and the secondary light emitted by the wavelength conversion particles. For example, a blue LED may be used for the light emitting element 20, and a phosphor such as YAG or the like may be used for the wavelength conversion particles. In this case, the light emitting device can output white light obtained as a result of mixing blue light from the blue LED and yellow light emitted by the phosphor excited by the blue light. Alternatively, a blue LED may be used for the light emitting element 20, and a β-SiAlON-based phosphor, which can emit green light, and a manganese-activated fluoride-based phosphor, which can emit red light, may be used for the wavelength conversion particles. In this case, the light emitting device can output white light.

The wavelength conversion particles may be dispersed uniformly in the light-transmissive member 50, or may be locally positioned closer to the light emitting element 20 than to a top surface of the light-transmissive member 50. In the case where the wavelength conversion particles are locally positioned closer to the light emitting element 20 than to a top surface of the light-transmissive member 50, even if the wavelength conversion particles, which are weak against moisture, are used, a base material of the light-transmissive member 50 serves as a protective layer. This alleviates deterioration of the wavelength conversion particles. Alternatively, as shown in FIG. 2, the light-transmissive member 50 may include a layer 51 and a layer 52, the layer 51 containing the wavelength conversion particles, the layer 52 containing substantially no wavelength conversion particles. The layer 52 is positioned higher than the layer 51 in the Z direction. With such a structure, the layer 52 serves as a protective layer, and thus can alleviate deterioration of the wavelength conversion particles. Examples of the material of the wavelength conversion particles weak against moisture include a manganese-activated fluoride-based phosphor. The manganese-activated fluoride-based phosphor emits light having a relatively narrow spectral line width, which is preferable from the point of view of color reproducibility. The expression that "contains substantially no wavelength conversion particles" indicates that unavoidable contamination with the wavelength conversion particles is not eliminated. It is preferable that the layer 52 has a content of the wavelength conversion particles of 0.05% by weight or lower.

The layer 51, of the light-transmissive layer 50, containing the wavelength conversion particles may comprise or be formed of a single layer or a plurality of layers. For example, as shown in FIG. 2, the light-transmissive layer 50 may include a first wavelength conversion layer 51A and a second wavelength conversion layer 51B covering the first wavelength conversion layer 51A. The second wavelength conversion layer 51B may directly cover the first wavelength conversion layer 51A, or may cover the first wavelength conversion layer 51A via another light-transmissive layer.

The first wavelength conversion layer 51A is located closer to the light extraction surface 201 of the light emitting element 20 than the second wavelength conversion layer 51B. It is preferable that the wavelength conversion particles contained in the first wavelength conversion layer 51A emit light having an emission peak wavelength shorter than an emission peak wavelength of light emitted by the wavelength conversion particles contained in the second wavelength conversion layer 51B. With such an arrangement, the wavelength conversion particles contained in the second wavelength conversion layer 51B can be excited by the light from the first wavelength conversion layer 51A, which is excited by the light emitting element 20. This can increase the amount of light from the wavelength conversion particles in the second wavelength conversion layer 51B.

It is preferable that the emission peak wavelength of light emitted by the wavelength conversion particles contained in the first wavelength conversion layer 51A is in a range of 500 nm or longer and 570 nm or shorter, and that the emission peak wavelength of light emitted by the wavelength conversion particles contained in the second wavelength conversion layer 51B is in a range of 610 nm or longer and 750 nm or shorter. With such an arrangement, the light emitting device can have a high color reproducibility.

For example, the wavelength conversion particles contained in the first wavelength conversion layer 51A may comprise or be formed of a β-SiAlON-based phosphor, and the wavelength conversion particles contained in the second wavelength conversion layer 51B may comprise or be formed of a phosphor containing manganese-activated potassium fluorosilicate. In the case where the wavelength conversion particles contained in the second wavelength conversion layer 51B comprises or is formed of a phosphor containing manganese-activated potassium fluorosilicate, it is especially preferable that the light-transmissive member 50 includes the first wavelength conversion layer 51A and the second wavelength conversion layer 51B. The phosphor containing manganese-activated potassium fluorosilicate is likely to cause brightness saturation. However, the first wavelength conversion layer 51A positioned between the second wavelength conversion layer 51B and the light emitting element 20 can suppress the phosphor containing manganese-activated potassium fluorosilicate from being excessively irradiated with light from the light emitting element 20. This can reduce degradation of the phosphor containing manganese-activated potassium fluorosilicate.

The light-transmissive member 50 may include first wavelength conversion particles that absorb at least a part of primary light emitted by the light emitting element 20 and emit secondary light by forbidden transition, and second wavelength conversion particles that absorb at least a part of primary light emitted by the light emitting element 20 and emit the secondary light by allowed transition. In general, the first wavelength conversion particles that emit the secondary light by forbidden transition has a longer afterglow time than that of the second wavelength conversion particles that emit the secondary light by allowed transition. The light-transmissive member 50 containing a CASN-based phosphor and a phosphor containing manganese-activated potassium fluorosilicate can shorten the afterglow time as compared with the light-transmissive member 50 containing only a phosphor containing manganese-activated potassium fluorosilicate. In general, manganese-activated potassium fluorosilicate emits light having an emission peak having a narrower half width than that of light emitted by a CASN-based phosphor, and thus provides a higher color purity and a higher color reproducibility. Therefore, the light-transmissive member 50 containing a CASN-based phosphor and a phosphor containing manganese-activated potassium fluorosilicate can improve the color reproducibility as compared with the light-transmissive member 50 containing only a CASN-based phosphor.

The weight of the phosphor containing manganese-activated potassium fluorosilicate contained in the light-transmissive member 50 is preferably, for example, in the range of from 0.5 times to 6 times the weight of the CASN-based phosphor, more preferably in the range of form 1 time to 5 times, the weight of the CASN-based phosphor, and still more preferably in the range of from 2 times to 4 times the weight of the CASN-based phosphor. A larger weight of the phosphor containing manganese-activated potassium fluorosilicate can improve the color reproducibility of the light emitting device. A larger weight of the CASN-based phosphor can shorten the afterglow time.

It is preferable that the phosphor containing manganese-activated potassium fluorosilicate has an average particle size of 5 μm or more and 30 μm or less. It is preferable that the CASN-based phosphor has an average particle size of 5 μm or more and 30 μm or less. With the structure in which the phosphor containing manganese-activated potassium fluorosilicate and/or the CASN-based phosphor has an average particle size of 30 μm or less, light from the light emitting element 20 is more likely to be diffused by the wavelength conversion particles. This can reduce the color non-uniformity of distributed light of the light emitting device. With the structure in which the phosphor containing manganese-activated potassium fluorosilicate and/or the CASN-based phosphor has an average particle size of 5 μm or more, the light from the light emitting element 20 is more likely to be extracted. This improves the light extraction efficiency of the light emitting device.

The CASN-based phosphor and the phosphor containing manganese-activated potassium fluorosilicate may be contained in the same wavelength conversion layer of the light-transmissive member 50. Alternatively, the light-transmissive member 50 includes a plurality of wavelength conversion layers, the CASN-based phosphor and the phosphor containing manganese-activated potassium fluorosilicate may be contained in different wavelength conversion layers from each other. In the case where the phosphor containing manganese-activated potassium fluorosilicate and the CASN-based phosphor are contained in different wavelength conversion layers from each other, it is preferable that, between the wavelength conversion particles formed of the phosphor containing manganese-activated potassium fluorosilicate and the wavelength conversion particles formed of the CASN-based phosphor, the wavelength conversion particles having a shorter emission peak wavelength is positioned closer to the light emitting element 20. With such an arrangement, the wavelength conversion particles emitting light having a longer emission peak wavelength can be excited by light from the wavelength conversion particles having a shorter emission peak wavelength. In the case where, for example, the emission peak wavelength of light emitted by the phosphor containing manganese-activated potassium fluorosilicate is around 631 nm and the emission peak wavelength of light emitted by the CASN-based phosphor is around 650 nm, it is preferable that the wavelength conversion particles formed of the phosphor containing manganese-activated potassium fluorosilicate are positioned closer to the light emitting element 20.

The second wavelength conversion particles may alternatively comprise or be formed of a SCASN-based phosphor, a SLAN phosphor ($SrLiAl_3N_4$:Eu) or the like. For example, the light-transmissive member 50 may contain a SCASN-based phosphor and a phosphor containing manganese-activated potassium fluorosilicate. Alternatively, the light-transmissive member 50 may contain the first wavelength conversion particles of a red phosphor, and the second wavelength conversion particles comprising or formed of a β-SiAlON-based phosphor, which is a green phosphor. Such an arrangement improves the color reproducibility of the light emitting device.

(Step of Forming a Second Bottom Surface)

Figure 5:
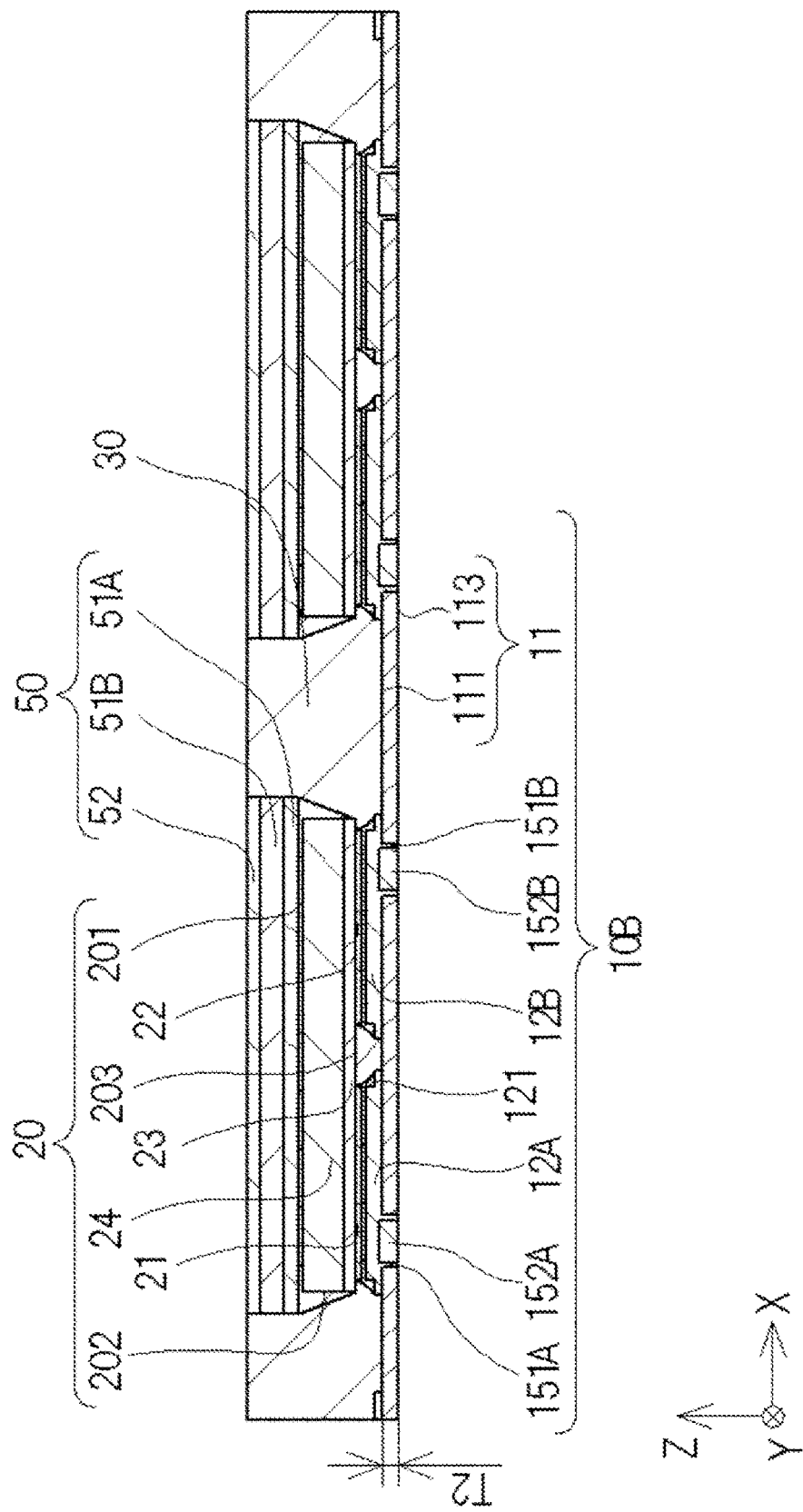
FIG. 5 is a schematic cross-sectional view showing a step in a method for producing a light emitting device according to embodiment 1.

As shown in FIG. 5, a part of the base member 11 is removed from the side of the first bottom surface 112 of the base member 11. In other words, a part of the base member 11 is removed from the side of a surface opposite to the top surface 111 of the base member 11. This thins the base member 11 in the Z direction to form a second bottom surface 113 of the base member 11. Note that, in this specification, the base member 11 and the second wiring portions 151A and 151B included in the precursor substrate 10A, the post-removal substrate, the individual substrate and/or the external electrodes-attached substrate will be described with the same names regardless of whether a part of the base member 11 has been removed or not.

As a result of thinning the base member 11, the light emitting device can be thinned. During the formation of the second bottom surface 113 of the base member 11, each of the second wiring portions 151A and 151B may or may not be partially removed. In the case where each of the second wiring portions 151A and 151B is partially removed during the formation of the second bottom surface 113, the second wiring portions 151A and 151B are more likely to be exposed from the second bottom surface 113 of the base member 11. In the case where the intermediate body 100 includes the filling members 152A and 152B filling the regions enclosed by the second wiring portions 151A and 151B, the filling members 152A and 152B may each be removed partially during the formation of the second bottom surface 113 of the base member 11.

In the case where the second wiring portions 151A and 151B are formed from the top surface 111 to the second bottom surface 113 of the base member 11 but are not formed below the second bottom surface 113, it can be possible to expose the second wiring portions 151A and 151B from the second bottom surface 113 of the base member 11 without partially removing any of the second wiring portions 151A and 151B. In the case where the second wiring portions 151A and 151B are not exposed from the first bottom surface 112 of the base member 11 in the precursor substrate 10A, the second bottom surface 113 of the base member 11 is formed to expose the second wiring portions 151A and 151B from the second bottom surface 113 of the base member 11.

As a method for removing a part of the base member 11, a known method such as grinding, etching, cutting, abrasive blasting or the like is usable. It is advantageous to use grinding as a method for removing a part of the base member 11. Such a method makes it easy to flatten the second bottom surface 113 of the base member 11. In the case where a plurality of light emitting devices are to be produced, the structure in which the second bottom surface 113 of the base member 11 is flat can alleviate variance in shape among the plurality of light emitting devices.

It is preferable that a maximum thickness T2 from the top surface 111 to the second bottom surface 113 in the Z direction is 20 μm or greater and 60 μm or less. The "maximum thickness from the top surface 111 to the second bottom surface 113 in the Z direction" refers to the maximum thickness of the base member 11 of the post-removal substrate (represented by reference numeral 10B in FIG. 5). The structure in which the thickness from the top surface 111 to the second bottom surface 113 in the Z direction is 20 μm or greater improves the strength of the base member 11. The structure in which the thickness from the top surface 111 to the second bottom surface 113 in the Z direction is 60 μm or less can thin the light emitting device. The thickness from the top surface 111 to the second bottom surface 113 is preferably at least 0.05 times and at most 0.6 times, is more preferably at least 0.1 times and at most 0.5 times, and is still more preferably at least 0.2 times and at most 0.4 times the thickness from the top surface 111 to the first bottom surface 112.

(Step of Forming a Pair of External Electrodes on the Second Bottom Surface)

Figure 6:
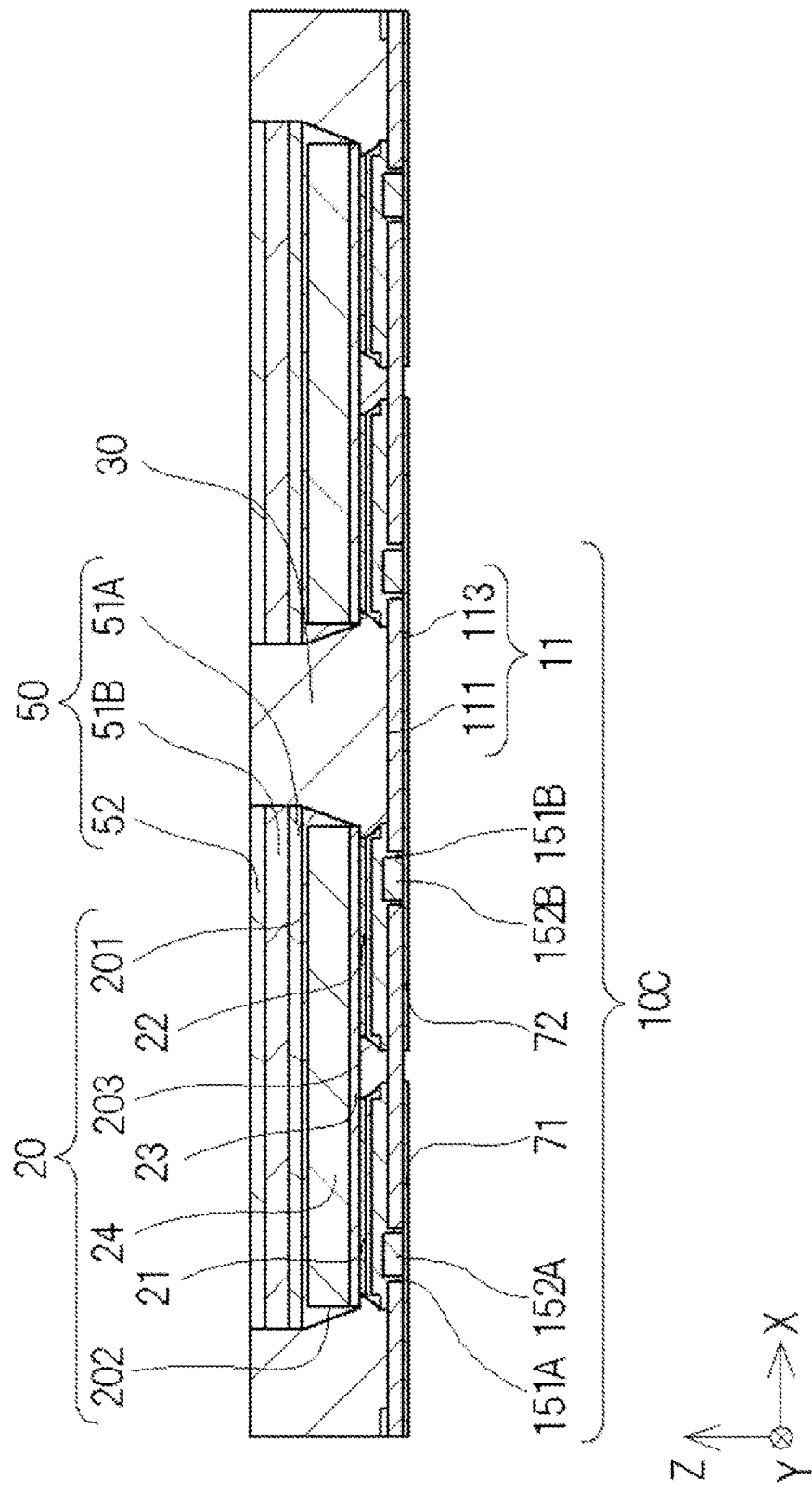
FIG. 6 is a schematic cross-sectional view showing a step in the method for producing the light emitting device according to embodiment 1.

As shown in FIG. 6, a pair of external electrodes 71 and 72 to be electrically connected with the second wiring portions 151A and 151B respectively are formed on the second bottom surface 113. The "pair of external electrodes" refer to two electrodes serving as a positive electrode and a negative electrode. Therefore, each individual substrate includes the pair of external electrodes 71 and 72 separate from each other so as to serve as a pair of electrodes, i.e., a positive electrode and a negative electrode. In the external electrodes-attached substrate (represented by reference sign 10C in FIG. 6) before the step of division into individual substrates, plural pairs of external electrodes 71 and 72 may be separate from each other or may be continuous to each other. In this specification, as long as the external electrodes-attached substrate 10C includes a portion that is to become the pair of external electrodes 71 and 72 separate from each other in each of the areas which are to become individual substrates (see, areas A shown in FIG. 3), the external electrodes-attached substrate 10C is described as including the pair of external electrodes 71 and 72.

As a method for forming the pair of external electrodes 71 and 72, a known method such as sputtering, vapor deposition, atomic layer deposition (ALD), plating or the like is usable. It is advantageous to use sputtering as a method for forming the pair of external electrodes 71 and 72. Such a method makes it easy to increase the joining strength between the second bottom surface 113 of the base member 11 and the external electrodes 71 and 72. This is less likely to be detached the external electrodes 71 and 72 from the second bottom surface 113 of the base member 11. In order to prevent the pair of external electrodes 71 and 72 from being connected with each other to cause shortcircuiting, a mask or the like may be used.

Figure 7:
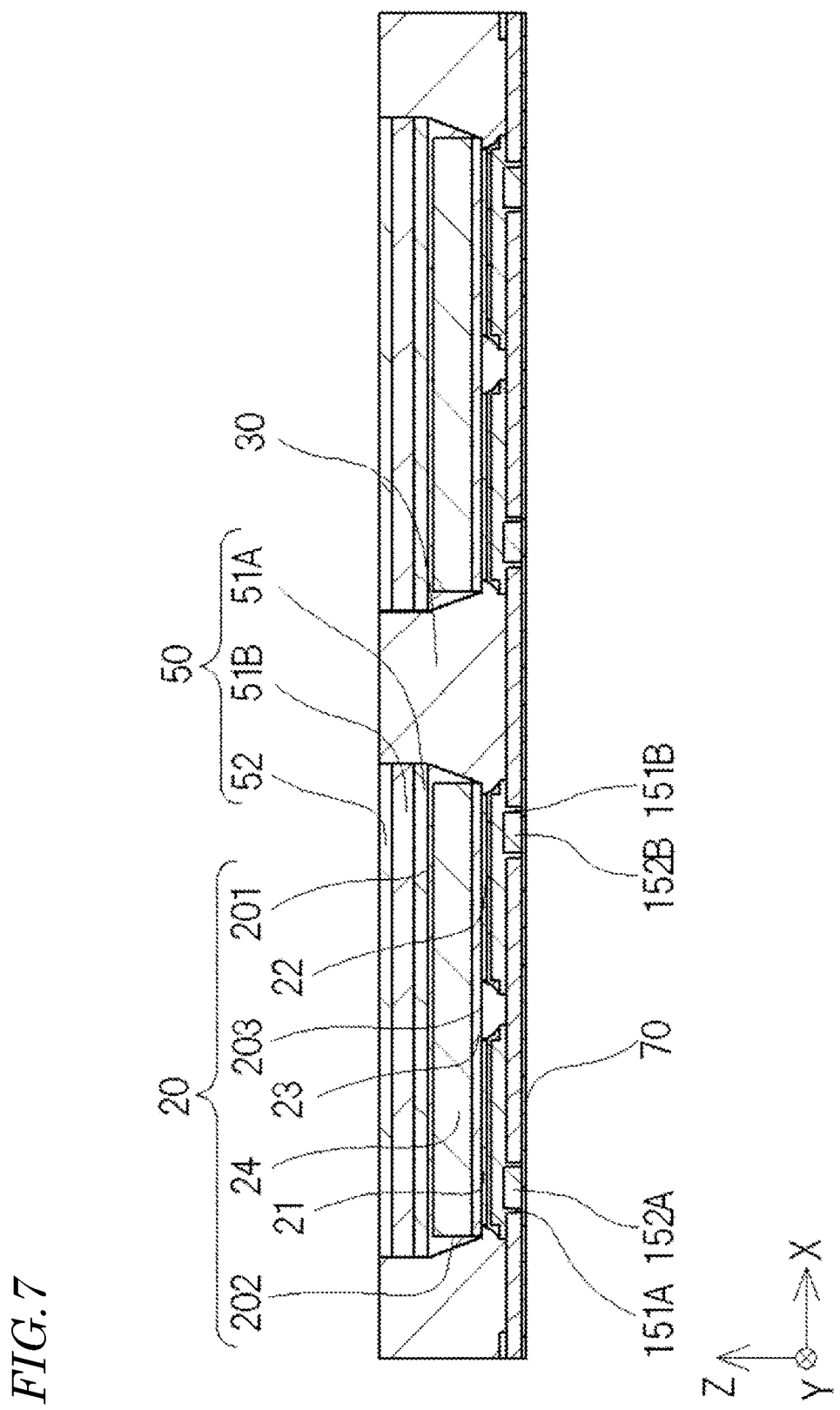
FIG. 7 is a schematic cross-sectional view showing a step in the method for producing the light emitting device according to embodiment 1.

As shown in FIG. 7, a metal layer 70 continuously covering the pair of second wiring portions 151A and 151B and the second bottom surface 113 of the base member 11 may be formed, and then the pair of external electrodes 71 and 72, shown in FIG. 6, to be electrically connected with the second wiring portions 151A and 151B respectively may be formed on the second bottom surface 113. At least a part, of the metal layer 70, that is positioned between the pair of second wiring portions 151A and 151B may be removed to form the pair of external electrodes 71 and 72 electrically connected with the pair of second wiring portions 151A and 151B respectively. As a method for removing a part of the metal layer 70, a known method such as laser ablation, etching, abrasive blasting or the like is usable.

It is advantageous to employ laser ablation as a method for removing a part of the metal layer 70. Laser ablation can pattern the metal layer 70 with no use of a mask or the like. Radiation of laser light toward the metal layer 70 on the base member 11 can cause a partial removal of the metal layer 70. Laser ablation patterns the metal layer 70, and as a result, the metal layer 70 can be formed into the external electrodes 71 and 72. "Laser ablation" is a phenomenon that when the illumination strength of laser light caused to radiate toward a surface of a solid body reaches a certain level (threshold), the surface of the solid body is removed.

In the case where radiation of laser light is used as a method for removing a part of the metal layer 70, it is advantageous to select to use laser light having a wavelength of a low reflectance against the metal layer 70, for example, a wavelength of a reflectance of 90% or lower. In the case where, for example, an outermost surface of the metal layer 70 comprises or is formed of Au, it is more preferable to use laser light having a wavelength shorter than the wavelength in a green region (e.g., 550 nm) than to use laser light having a wavelength in a red region (e.g., 640 nm). Such an arrangement can cause ablation with high efficiency and improve the mass-producibility.

(Step of Division into Individual Substrates)

Figure 8:
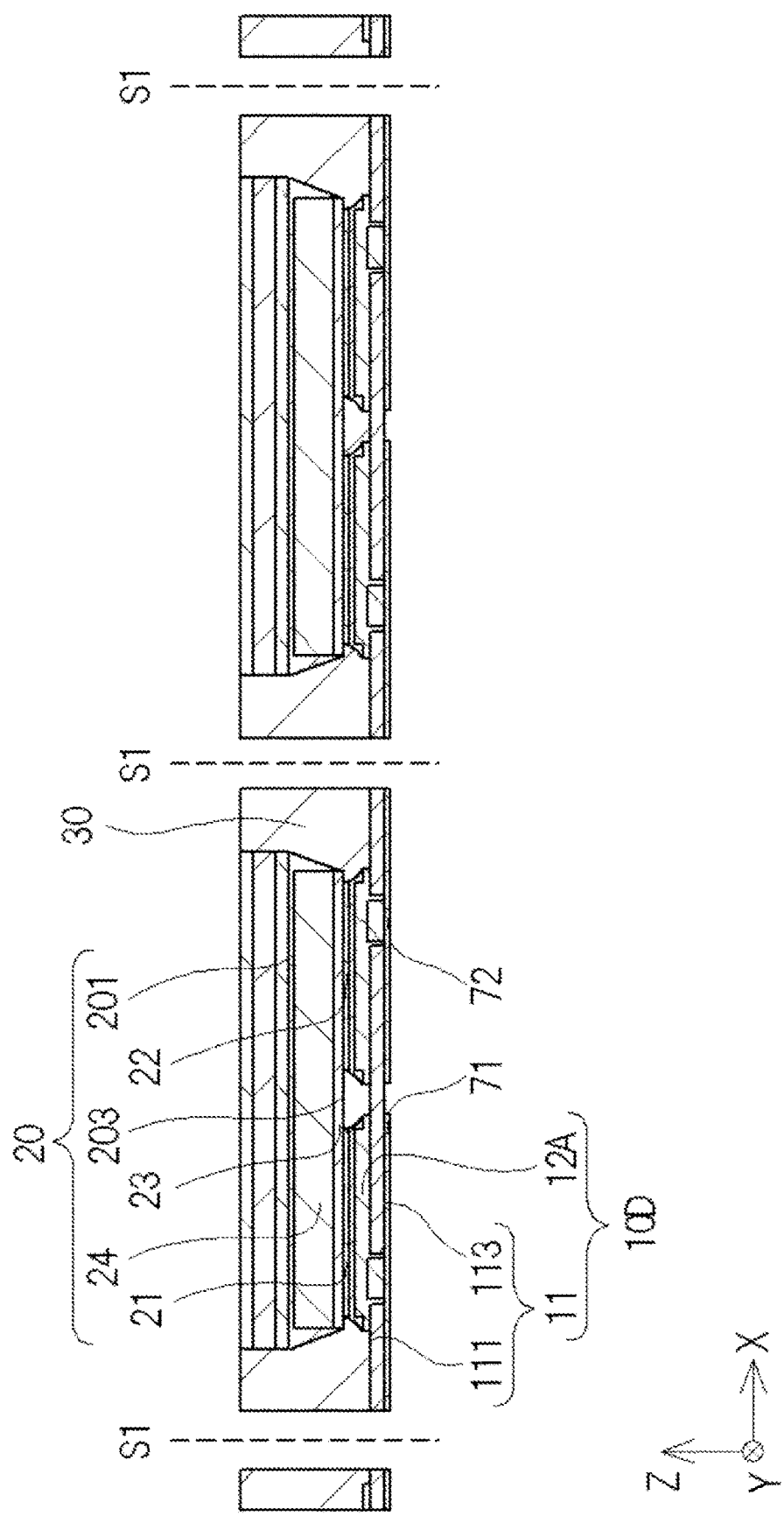
FIG. 8 is a schematic cross-sectional view showing a step in the method for producing the light emitting device according to embodiment 1.

As schematically shown in FIG. 8, the first reflective member 30 and the external electrodes-attached substrate 10C may be cut along dashed lines S1 between light emitting element 20 adjacent to each other and/or between the light emitting element 20 and an outer lateral surface of the external electrodes-attached substrate 10C by blade dicing, laser dicing or the like to provide a plurality of light emitting devices. The individual substrates obtained by cutting the external electrodes-attached substrate 10C may each be referred to as an "individual substrate 10D".

By performing the above-described steps, a light emitting device 1000 as shown in FIG. 9 through FIG. 16 can be produced.

The light emitting device 1000 according to embodiment 1 includes the individual substrate 10D (hereinafter, it may be referred to simply as a "substrate 10D") and the light emitting element 20 (see, e.g., FIG. 10). The substrate 10D includes the base member 11, the pair of first wiring portions 12A and 12B, the pair of external electrodes 71 and 72, and the pair of second wiring portions 151A and 151B. The base member 11 includes the top surface 111 and the second bottom surface 113 positioned opposite to the top surface 111. The pair of first wiring portions 12A and 12B are located on the top surface 111 of the base member 11. The pair of external electrodes 71 and 72 are located on the second bottom surface 113 of the base member 11. The light emitting element 20 includes the light extraction surface 201, the electrodes formation surface 203 opposite to the light extraction surface 201, the lateral surfaces 202 between the light extraction surface 201 and the electrodes formation surface 203, and the pair of element electrodes 21 and 22 on the electrodes formation surface 203. The pair of element electrodes 21 and 22 and the first wiring portions 12A and 12B face each other, and the light emitting element 20 is located on the first wiring portions 12A and 12B.

It is preferable that a maximum thickness T3 (FIG. 10) of the base member 11 is at least 0.3 times and at most 4 times a maximum distance T4 from the electrodes formation surface 203 to the top surface 111 of the base member 11. The maximum thickness T3 of the base member 11 is more preferably at least 0.4 times and at most twice, and is still more preferably at least 0.5 times and at most equal to, the maximum distance T4 from the electrodes formation surface 203 to the top surface 111 of the base member 11. Such an arrangement can decrease the maximum thickness T3 of the base member 11, and thus can thin the light emitting device 1000. The "maximum thickness T3 of the base member 11" refers to the maximum thickness from the top surface 111 to the second bottom surface 113 of the base member 11 in the Z direction. The "maximum distance T4 from the electrodes formation surface 203 to the top surface 111 of the base member 11" refers to the maximum distance from the electrodes formation surface 203 to the top surface 111 of the base member 11 in the Z direction. In other words, the "maximum distance T4 from the electrodes formation surface 203 to the top surface 111 of the base member 11" refers to the maximum total thickness of the element electrodes (the thickness of element electrodes 21 or 22) and the conductive bonding member 60 in the Z direction. The expression "top surface 111 of the base member 11" used regarding the maximum distance T4 from the electrodes formation surface 203 to the top surface 111 of the base member 11 refers to a portion, of the top surface 111 of the base member 11, that overlaps the element electrodes 21 and 22 as seen in a plan view. In the case where, for example, the base member 11 has a recessed portion formed as being separate from the light emitting element 20 as seen in a plan view, the expression "top surface 111 of the base member 11" used regarding the maximum distance T4 from the electrodes formation surface 203 to the top surface 111 of the base member 11 does not refer to a top surface in the recessed portion.

As described above, the light emitting device 1000 may include the first reflective member 30 and/or the light-transmissive member 50. The first reflective member 30 may have a portion positioned between the electrodes formation surface 203 and the top surface 111 of the base member 11. In the case where the light emitting device 1000 includes the first reflective member 30 and the first reflective member 30 covers the electrodes formation surface 203 of the light emitting element 20 and the top surface 111 of the base member 11, it is preferable that the maximum distance from the electrodes formation surface 203 to the top surface 111 of the base member 11 is sufficiently long to prevent transmission of the light from the light emitting element 20. Increasing the thickness of the first reflective member 30 alleviates transmission of the light from the light emitting element 20 through the first reflective member 30. This can alleviate absorption of the light from the light emitting element 20 into the base member 11, and thus can improve the light extraction efficiency of the light emitting device 1000. Regarding the expression "alleviates transmission of the light from the light emitting element 20", it is preferable that at least 50% of the light from the light emitting element 20 is not transmitted, it is more preferable that at least 60% of the light from the light emitting element 20 is not transmitted, and it is still more preferable that at least 70% of the light from the light emitting element 20 is not transmitted.

It is preferable that the base member 11 has a Vickers hardness higher than a Vickers hardness of the first reflective member 30. This is less likely to deform the base member 11, and thus can alleviate warping of the base member 11. The "Vickers hardness" is one of measures that indicate the hardness. The Vickers hardness may be calculated as follows. An indenter (rigid body formed of diamond) is pushed into a test target with a test force, and the surface area of the resulting indentation is measured. The test force applied to the indenter is divided by the size of the area. In this manner, the Vickers hardness can be found.

Figure 11:
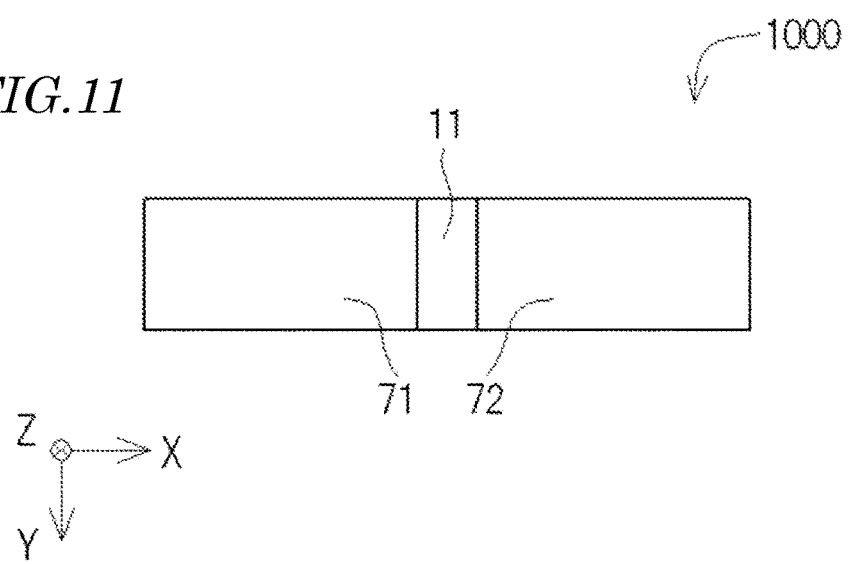
FIG. 11 is a schematic bottom view of the light emitting device according to embodiment 1.
Figure 12:
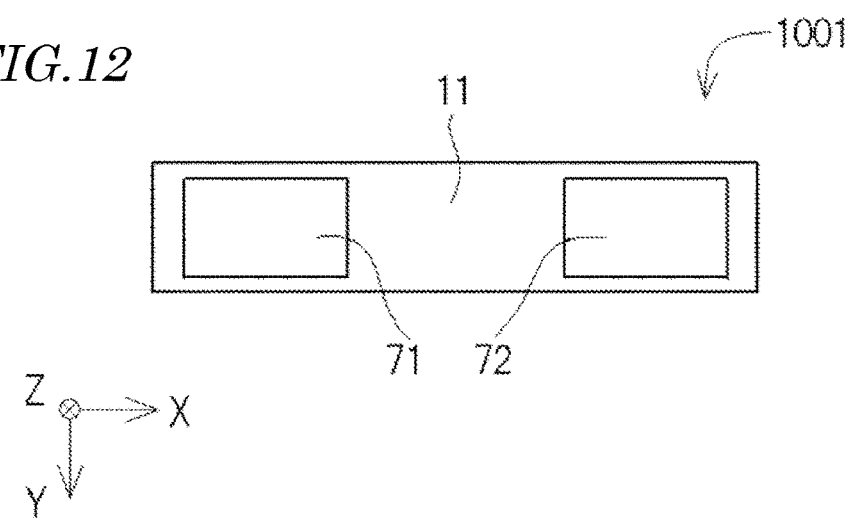
FIG. 12 is a schematic bottom view of a modification of the light emitting device according to embodiment 1.

As shown in FIG. 11, the external electrodes 71 and 72 may be formed in a manner that they reach the lateral surfaces of the base member 11. In the case where the external electrodes 71 and 72 are formed in contact with the lateral surfaces of the base member 11 (as shown in FIG. 11), electricity can be supplied easily from the external electrodes 71 and 72 even in a light emitting device of a side view type in which one of the lateral surfaces of the base member 11 is located to face the mounting substrate. Alternatively, as shown in FIG. 12, the external electrodes 71 and 72 may be formed as being away from the lateral surfaces of the base member 11. In the case where the external electrodes 71 and 72 are formed as being away from the lateral surfaces of the base member 11, generation of burr in the external electrodes 71 and 72 can be alleviated.

Figure 13:
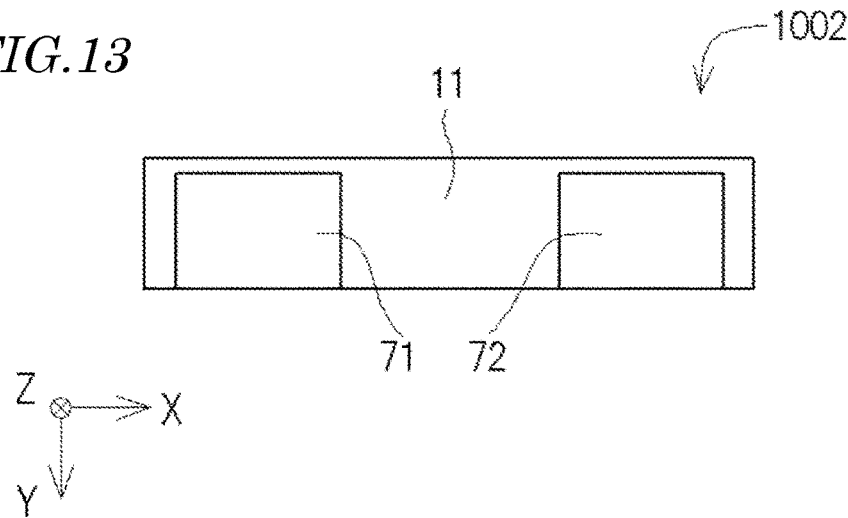
FIG. 13 is a schematic bottom view of another modification of the light emitting device according to embodiment 1.

Still alternatively, as shown in FIG. 13, the external electrodes 71 and 72 may be formed in contact with one of the lateral surfaces of the base member 11 but as being away from the other three lateral surfaces. In this case, in a light emitting device of a side view type in which the lateral surface of the base member 11 that is in contact with the external electrodes 71 and 72 is located to face the mounting substrate and is bonded with the mounting substrate with a conductive bonding member formed of solder or the like, formation of the conductive bonding member on the lateral surfaces that are not in contact with the external electrodes 71 and 72 can be alleviated.

Figure 14:
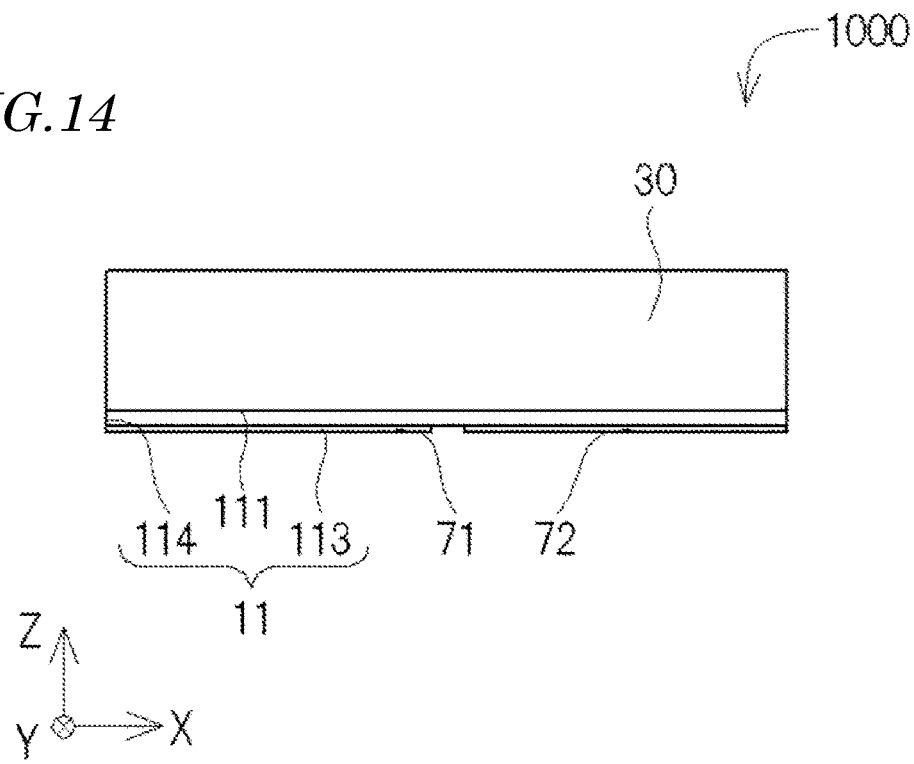
FIG. 14 is a schematic side view of the light emitting device according to embodiment 1.
Figure 15:
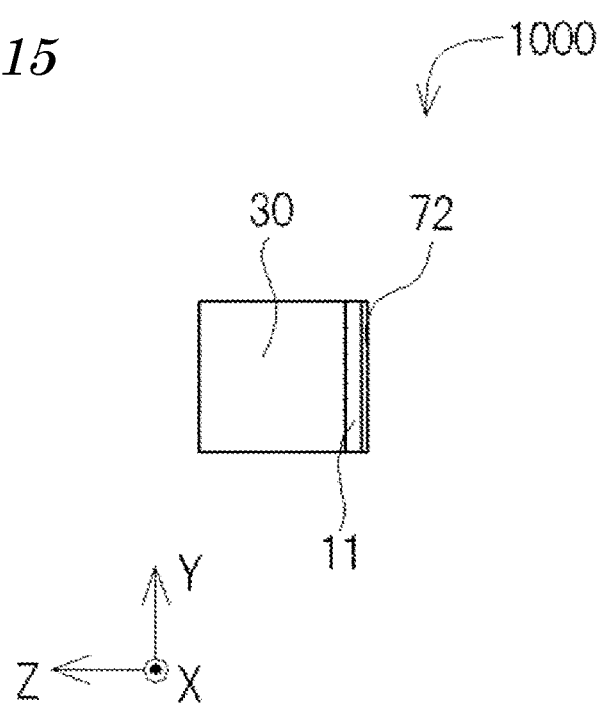
FIG. 15 is a schematic side view of the light emitting device according to embodiment 1.
Figure 16:
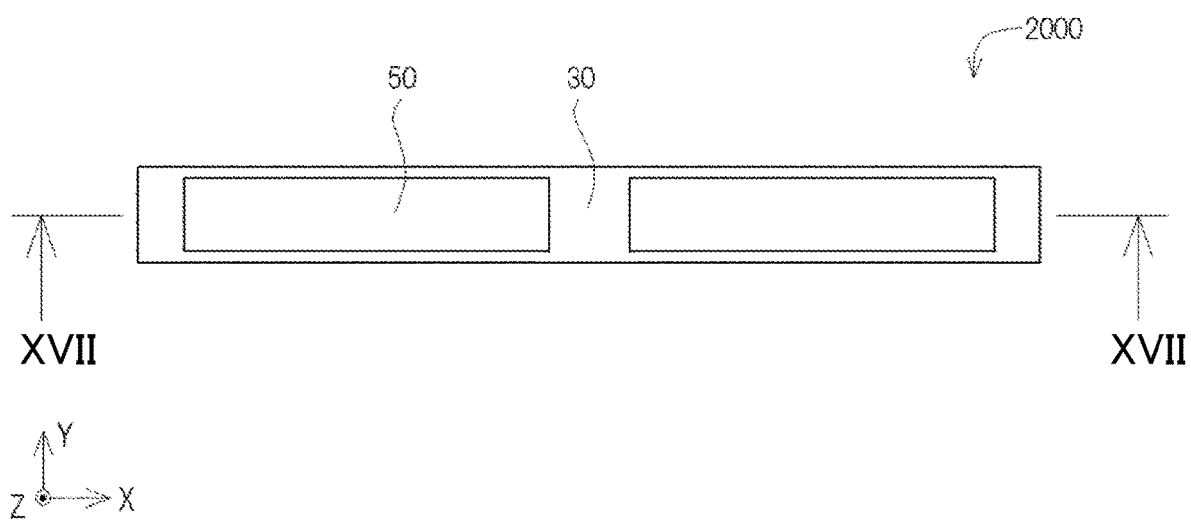
FIG. 16 is a schematic plan view of a light emitting device according to embodiment 2.

As shown in FIG. 14 and FIG. 15, it is preferable that a lateral surface of the first reflective member 30 and a lateral surface of the base member 11 are in the same plane. This can make the light emitting device 1000 compact. The lateral surface of the first reflective member 30 and the lateral surface of the base member 11 can be in the same plane by, for example, cutting the first reflective member 30 and the base member 11 simultaneously in the step of division into individual substrates. In this specification, the term "in the same plane" allows a tolerance of about ±5 μm.

Embodiment 2

A method for producing a light emitting device according to embodiment 2 will be described. The method for producing the light emitting device according to embodiment 2 is substantially the same as the method for producing the light emitting device according to embodiment 1 except for the step of providing an intermediate body and the step of division into individual substrates.

(Step of Providing an Intermediate Body)

In the method for producing the light emitting device according to embodiment 1, it is sufficient that the intermediate body includes at least one light emitting element. In the method for producing the light emitting device according to embodiment 2, an intermediate body including a plurality of light emitting elements is provided.

(Step of Division into Individual Substrates)

The first reflective member 30 and the external electrodes-attached substrate are cut by blade dicing, laser dicing or the like such that each of the light emitting devices includes a plurality of light emitting elements 20. In this manner, a light emitting device 2000 according to embodiment 2 can be produced.

The light emitting device 2000 according to embodiment 2 includes the substrate 10D and a plurality of light emitting elements. In an example shown in FIG. 17, the light emitting device 2000 includes a first light emitting element 20A and a second light emitting element 20B. The first light emitting element 20A and/or the second light emitting element 20B may be referred to simply as the "light emitting element". The first light emitting element 20A and the second light emitting element 20B may emit light having the same emission peak wavelength as each other, or may emit light having different emission peak wavelengths from each other. In the case where, for example, the first light emitting element 20A and the second light emitting element 20B emit light having the same emission peak wavelength as each other, the emission peak wavelength of the light emitted by the first light emitting element 20A and the second light emitting element 20B may be in the range of 430 nm or longer and shorter than 490 nm (i.e., wavelength range of blue light). In the case where the first light emitting element 20A and the second light emitting element 20B emit light having different emission peak wavelengths from each other, the emission peak wavelength of the light emitted by the first light emitting element 20A may be in the range of 430 nm or longer and shorter than 490 nm (i.e., wavelength range of blue light), whereas the emission peak wavelength of the light emitted by the second light emitting element 20B may be in the range of 490 nm or longer and 570 nm or shorter (i.e., wavelength range of green light). With such an arrangement, the light emitting device 2000 can have an improved color reproducibility. In this specification, the expression that the "emission peak wavelength is the same" indicates that a tolerance of about ±10 nm is allowed.

Figure 17:
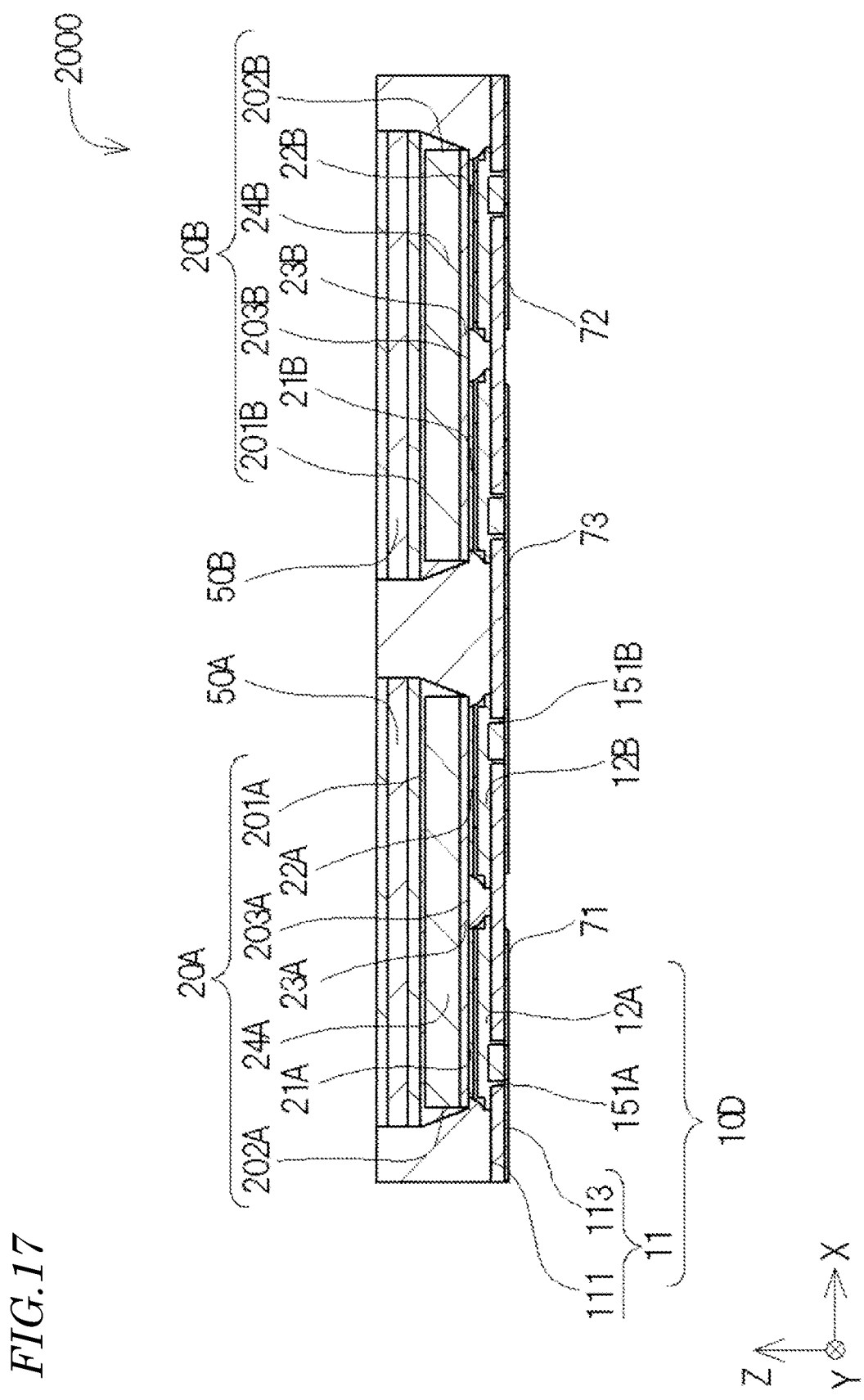
FIG. 17 is a schematic cross-sectional view taken along line XVII-XVII in FIG. 16.

The light emitting device 2000 may include a plurality of light-transmissive members. For example, as shown in FIG. 17, the light emitting device 2000 may include a first light-transmissive member 50A covering the first light emitting element 20A and a second light-transmissive member 50B covering the second light emitting element 20B. The wavelength conversion particles contained in the first light-transmissive member 50A and the wavelength conversion particles contained in the second light-transmissive member 50B may be of the same material or of different materials. In the case where the light emitting device 2000 includes the first light emitting element 20A emitting light having an emission peak wavelength in the range of 430 nm or longer and shorter than 490 nm (i.e., wavelength range of blue light) and the second light emitting element 20B emitting light having an emission peak wavelength in the range of 490 nm or longer and 570 nm or shorter (i.e., wavelength range of green light), the first light-transmissive member 50A may contain the wavelength conversion particles comprising or formed of a red phosphor, whereas the second light-transmissive member 50B may contain substantially no wavelength conversion particles. With such an arrangement, the light emitting device 2000 can have an improved color reproducibility. Light from the second light emitting element 20B is not blocked by the wavelength conversion particles, and therefore, the light extraction efficiency of the light emitting device 2000 can be improved. Examples of the red phosphor usable for the wavelength conversion particles contained in the first light-transmissive member 50A include a phosphor containing manganese-activated potassium fluorosilicate.

Figure 18:
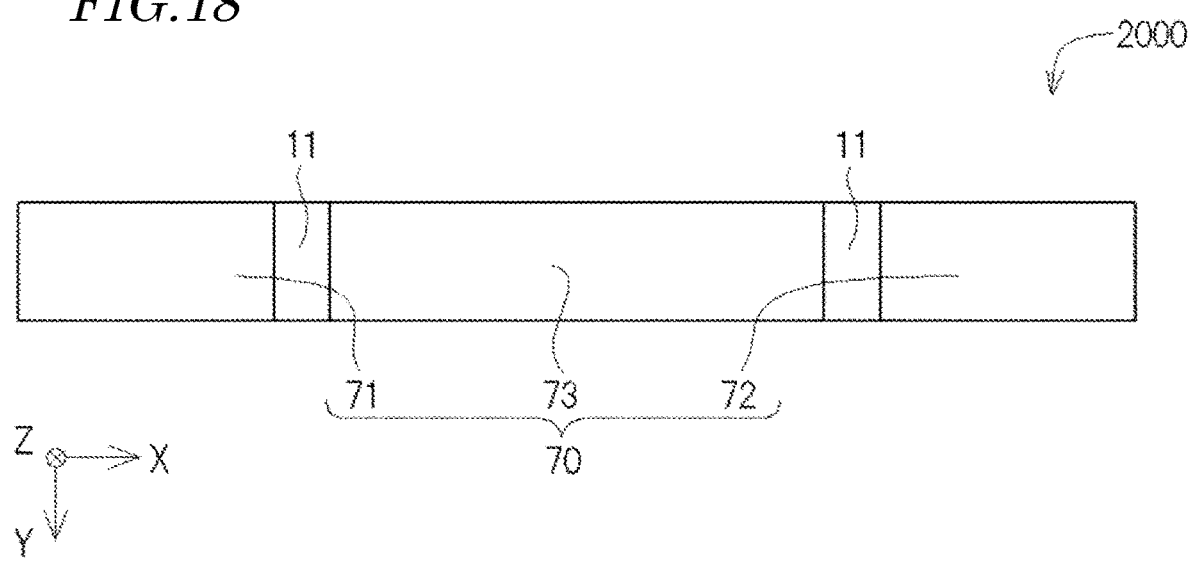
FIG. 18 is a schematic bottom view of the light emitting device according to embodiment 2.

As shown in FIG. 18, the light emitting device 2000 may include a heat dissipation portion 73 formed of a metal material between the pair of external electrodes 71 and 72. The light emitting device 2000 including the heat dissipation portion 73 allows heat from the light emitting elements 20A and 20B to be released through the heat dissipation portion 73. This improves the heat dissipation property of the light emitting device 2000. The first light emitting element 20A and the second light emitting element 20B may be electrically connected with each other via the heat dissipation portion 73.

Embodiment 3

Hereinafter, a method for producing a light emitting device according to embodiment 3 will be described. The method for producing the light emitting device according to embodiment 3 is substantially the same as the method for producing the light emitting device according to embodiment 1 except for the step of providing an intermediate body and the step of division into individual substrates.

(Step of Providing an Intermediate Body)

Figure 19:
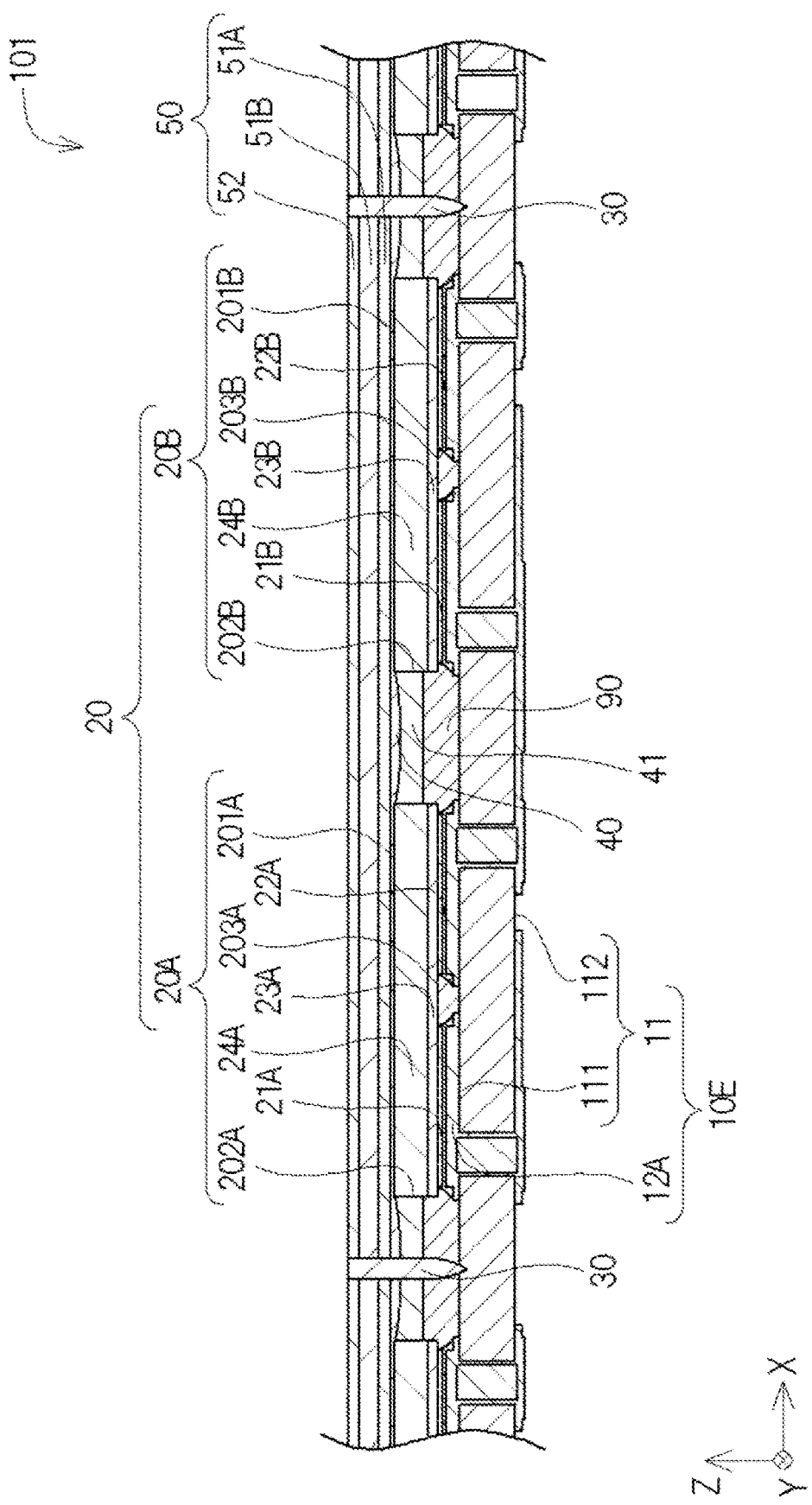
FIG. 19 is a schematic cross-sectional view showing a method for producing a light emitting device according to embodiment 3.

As shown in FIG. 19, an intermediate body 101 including a precursor substrate 10E and the light emitting element 20 is provided. It is sufficient that the intermediate body 101 includes at least one light emitting element 20. As shown in FIG. 19, the intermediate body 101 may include the first light emitting element 20A and the second light emitting element 20B. The intermediate body 101 may further include the first reflective member 30, a second reflective member 90, the first light guide member 40, a second light guide member 41, and the light-transmissive member 50.

In the example shown in FIG. 19, the first reflective member 30 is formed as being away from the light emitting element 20 and also to enclose the light emitting element 20 as seen in a plan view. In the case where the base member 11 has a recess in the top surface 111, a portion of the first reflective member 30 may be formed in the recess.

The second reflective member 90 is formed between the electrodes formation surface 203 of the light emitting element 20 and the top surface 111 of the base member 11. In this example, the second reflective member 90 has a portion arranged between the electrodes formation surface 203A of the light emitting element 20A and the top surface 111 of the base member 11, and also has a portion arranged between the electrodes formation surface 203B of the light emitting element 20B and the top surface 111 of the base member 11. The second reflective member 90 positioned between the electrodes formation surface 203 of the light emitting element 20 and the top surface 111 of the base member 11 can alleviate absorption of the light from the light emitting element 20 into the base member 11. The second reflective member 90 may be formed of a material same as, or similar to, that of the first reflective member 30. In the case where the second reflective member 90 contains a white pigment in a base material thereof, it is preferable that the white pigment is locally positioned closer to the top surface 111 of the base member 11. With such an arrangement, the light from the light emitting element 20 is less likely to be blocked by the second reflective member 90, and thus the light emitting device has an improved light extraction efficiency.

The first light guide member 40 secures the light extraction surface 201 of the light emitting element 20 and the light-transmissive member 50. The second light guide member 41 directly covers the lateral surfaces of the light emitting element 20 and the first reflective member 30. With the structure in which the second light guide member 41 directly covers the lateral surfaces of the light emitting element 20 and the first reflective member 30, the light from the light emitting element 20 is allowed to expand in an X direction and/or a Y direction more easily.

In the case where the intermediate body 101 includes the first light emitting element 20A and the second light emitting element 20B, it is preferable that the second light guide member 41 covers lateral surfaces 202A of the first light emitting element 20A and lateral surfaces 202B of the second light emitting element 20B. With such a structure, light from the first light emitting element 20A and light from the second light emitting element 20B are more likely to be guided to the second light guide member 41. In the case where, for example, the first light emitting element 20A and the second light emitting element 20B emit light having the same peak emission wavelength as each other, unevenness in luminance in a region between the first light emitting element 20A and the second light emitting element 20B can be alleviated as a result of the light from the first light emitting element 20A and the light from the second light emitting element 20B being guided to the second light guide member 41. In the case where the first light emitting element 20A and the second light emitting element 20B emit light having different peak emission wavelengths from each other, the light emitting device can have an improved color mixability as a result of the light from the first light emitting element 20A and the light from the second light emitting element 20B being guided to the second light guide member 41.

In the case where the intermediate body 101 includes the first light emitting element 20A and the second light emitting element 20B, it is preferable that the light-transmissive member 50 covers a light extraction surface 201A of the first light emitting element 20A and a light extraction surface 201B of the second light emitting element 20B. With such a structure, the light from the first light emitting element 20A and the light from the second light emitting element 20B are more likely to be guided to the light-transmissive member 50.

In the case where, for example, the first light emitting element 20A and the second light emitting element 20B emit light having the same peak emission wavelength as each other, unevenness in luminance in a region between the first light emitting element 20A and the second light emitting element 20B can be alleviated as a result of the light from the first light emitting element 20A and the light from the second light emitting element 20B being guided to the light-transmissive member 50. In the case where the first light emitting element 20A and the second light emitting element 20B emit light having different peak emission wavelengths from each other, the light emitting device can have an improved color mixability of as a result of the light from the first light emitting element 20A and the light from the second light emitting element 20B being guided to the light-transmissive member 50.

(Step of Division into Individual Substrates)

Figure 20:
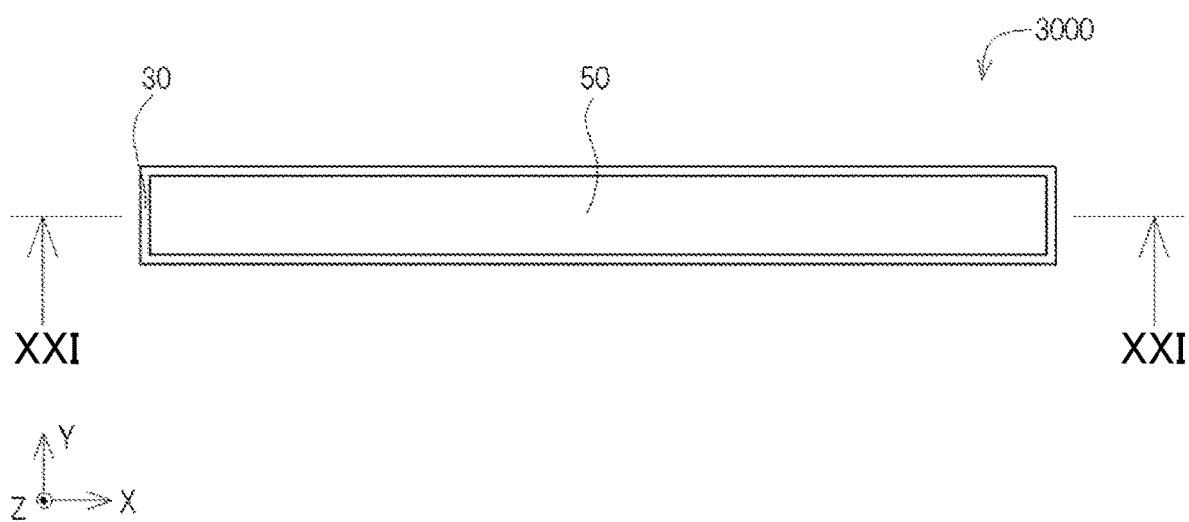
FIG. 20 is a schematic plan view of the light emitting device according to embodiment 3.
Figure 21:
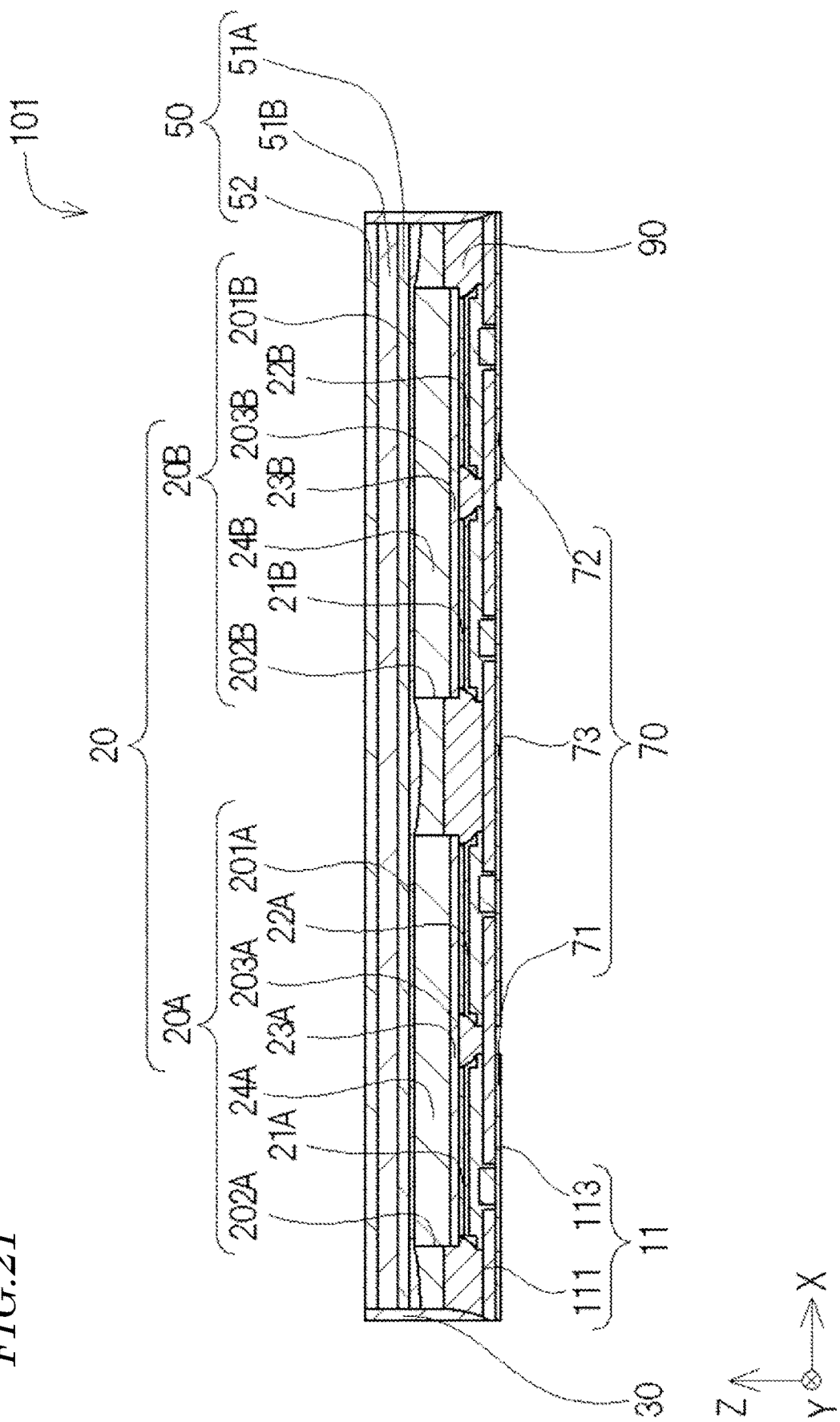
FIG. 21 is a schematic cross-sectional view taken along line XXI-XXI in FIG. 20.

The first reflective member 30 and the external electrodes-attached substrate are cut by blade dicing, laser dicing or the like to produce individual light emitting devices. The first reflective member 30 and the external electrodes-attached substrate may be cut such that each of the light emitting devices includes a plurality of light emitting elements 20. In this manner, a light emitting device 3000 according to embodiment 3 shown in FIG. 20 and FIG. 21 can be produced.

Hereinafter, components of the light emitting device in an embodiment according to the present disclosure will be described.

Substrate (Precursor Substrate, Post-Removal Substrate, Individual Substrate)

The substrate is a member on which the light emitting element 20 is placed. The substrate includes the base member 11, the pair of first wiring portions 12A and 12B, and the pair of second wiring portions 151A and 151B.

Base Member 11

The base member 11 may comprise or be formed of an insulating material such as a resin, a ceramic material, glass or the like. Examples of the resin includes epoxy, bismaleimide triazine (BT), polyimide, and the like. The base member 11 may comprise or be formed of a fiberglass-reinforced plastic (e.g., glass epoxy resin). The base member 11 may contain a white pigment such as titanium oxide or the like. Examples of the ceramic material include aluminum oxide, aluminum nitride, zirconium oxide, zirconium nitride, titanium oxide, titanium nitride, a mixture thereof, and the like. Among these materials, it is preferable to use, especially, a material having a coefficient of linear thermal expansion close to that of the light emitting element.

First Wiring Portions 12A and 12B

The first wiring portions are located on the top surface of the base member, and are electrically connected with the light emitting element. The first wiring portions may comprise or be formed of material comprising copper, iron, nickel, tungsten, chromium, aluminum, silver, gold, titanium, palladium, rhodium, or an alloy thereof. The first wiring portions may each be formed of a single layer or a plurality of layers of any of the above-listed metal materials and alloys. From the point of view of, especially, the heat dissipation property, it is preferable to use copper or a copper alloy. The first wiring portions may include a surface layer of silver, platinum, aluminum, rhodium, gold or an alloy thereof from the point of view of, for example, the wettability on the conductive bonding member and/or the light reflectance.

Second Wiring Portions 151A and 151B

The second wiring portions are electrically connected with the first wiring portions respectively, and are positioned between the top surface of the base member and the first bottom surface of the base member. The second wiring portions may be formed of a conductive material same as, or similar to, that of the first wiring portions.

Light Emitting Element 20 (First Light Emitting Element, Second Light Emitting Element)

The light emitting element is a semiconductor element that itself emits light when being applied with a voltage. For the light emitting element, a known semiconductor element comprising or formed of a nitride semiconductor or the like can be used. The light emitting element may be, for example, an LED chip. The light emitting element includes at least a semiconductor layer, and in many cases, further includes a substrate (hereinafter referred to as an "element substrate"). The light emitting element includes element electrodes. The element electrodes may comprise or be formed of gold, silver, tin, platinum, rhodium, titanium, aluminum, tungsten, palladium, nickel or an alloy thereof. A preferable material for the semiconductor layer may be a nitride semiconductor. The nitride semiconductor is generally expressed by general formula $In_xAl_yGa_{1-x-y}N$ ($0 \leq x$, $0 \leq y$, $x+y \leq 1$). Other examples of material usable for the semiconductor layer include an InAlGaAs-based semiconductor, an InAlGaP-based semiconductor, zinc sulfide, zinc selenide, silicon carbide and the like. The element substrate of the light emitting element is generally a substrate for crystal growth, from which a semiconductor crystal forming the semiconductor layer may grow. Alternatively, the element substrate may be a support substrate which supports the semiconductor element structure that has been separated from the substrate for crystal growth. The element substrate may be light-transmissive, thereby enabling flip-chip mounting and exhibition of improved light extraction efficiency. The element substrate may be a substrate mainly containing sapphire, gallium nitride, aluminum nitride, silicon, silicon carbide, gallium arsenide, gallium phosphide, indium phosphide, zinc sulfide, zinc oxide, zinc selenide, diamond or the like. Among these materials, sapphire is preferable. The thickness of the element substrate may be appropriately selected, and is, for example, 0.02 mm or greater and 1 mm or less. From the point of view of the strength of the element substrate and/or the thickness of the light emitting device, it is preferred that the thickness of the element substrate is 0.05 mm or greater and 0.3 mm or less.

First Reflective Member 30

The first reflective member covers the lateral surfaces 202 of the light emitting element 20 and the top surface 111 of the base member, and thus provides a highly clear border between a light emitting region and a non-light emitting region in the light emitting device. At the emission peak wavelength of the light emitting element, the first reflective member has a light reflectance of preferably 70% or higher, more preferably 80% or higher, and still more preferably 90% or higher. For example, the first reflective member may comprise or be formed of a resin material containing a white pigment.

Light-Transmissive Member 50

The light-transmissive member covers the light extraction surface of the light emitting element and protects the light emitting element. The light-transmissive member may comprise or be formed of, for example, a resin. Examples of the resin usable for the light-transmissive member include a silicone resin, an epoxy resin, a phenol resin, a polycarbonate resin, an acrylic resin, and a modified resin thereof. As the material of the light-transmissive member, an epoxy resin is preferable because use of an epoxy resin can improve the hardness of the light emitting device than use of a silicone resin. A silicone resin and a modified resin thereof, which are highly resistant against heat and light, are also preferable as the material of the light-transmissive member. The light-transmissive member may contain wavelength conversion particles and/or diffusive particles.

Wavelength Conversion Particles

The wavelength conversion particles absorb at least a part of primary light emitted by the light emitting element and emit secondary light having a wavelength different from that of the primary light. The wavelength conversion particles may comprise one material or a combination of two or more materials among the examples shown below. In the case where the light-transmissive member includes a plurality of wavelength conversion layers, the wavelength conversion layers may contain wavelength conversion particles of the same material as each other or wavelength conversion particles of different materials from each other.

Examples of materials of the wavelength conversion particles emitting green light include a yttrium-aluminum-garnet-based phosphor (e.g., $Y_3(Al, Ga)_5O_{12}:Ce$), a lutetium-aluminum-garnet-based phosphor (e.g., $Lu_3(Al, Ga)_5O_{12}:Ce$), a terbium-aluminum-garnet-based phosphor (e.g., $Tb_3(Al, Ga)_5O_{12}:Ce$), a silicate-based phosphor (e.g., $(Ba, Sr)_2SiO_4:Eu$), a chlorosilicate-based phosphor (e.g., $Ca_8Mg(SiO_4)_4Cl_2:Eu$), a β-SiAlON-based phosphor (e.g., $Si_{6-z}Al_zO_zN_{8-z}:Eu$ ($0<z<4.2$)), an SGS-based phosphor (e.g., $SrGa_2S_4:Eu$), an alkaline earth alminate-based phosphor (e.g., $(Ba, Sr, Ca)Mg_xAl_{10}O_{16+x}:Eu$, Mn ($0 \leq x \leq 1$)), and the like. Examples of materials of the wavelength conversion particles emitting yellow light include an α-SiAlON-based phosphor (e.g., $M_z(Si, Al)_{12}(O, N)_{16}$ ($0 \leq z \leq 2$; M is Li, Mg, Ca, Y, or a lanthanide element excluding La and Ce), and the like. The above-described examples of material of the wavelength conversion particles emitting green light include a material usable as the wavelength conversion particles emitting yellow light. For example, the emission peak wavelength may be shifted toward the longer side so as to emit yellow light by substituting Gd for a part of Y in the yttrium-aluminum-garnet-based phosphor. The above-described examples of material of the wavelength conversion particles emitting yellow light include a material usable as wavelength conversion particles emitting orange light. Examples of materials of the wavelength conversion particles emitting red light include a nitrogen-containing calcium aluminosilicate (e.g., CASN or SCASN)-based phosphor, for example, $(Sr, Ca)AlSiN_3:Eu$, a SLAN phosphor ($SrLiAl_3N_4:Eu$), and the like. Another example of material of the wavelength conversion particles emitting red light may be a manganese-activated fluoride-based phosphor (phosphor represented by general formula (I): $A_2[M_{1-a}Mn_aF_6]$ (in general formula (I), A is at least one selected from the group consisting of K, Li, Na, Rb, Cs and $NH_4$; M is at least one element selected from the group consisting of the group IV elements and the group XIV elements; and "a" satisfies 0<a<0.2)). A representative example of the manganese-activated fluoride-based phosphor is a phosphor containing manganese-activated potassium fluorosilicate (e.g., $K_2SiF_6$:Mn).

Diffusive Particles

Examples of materials of the diffusive particles include silicon oxide, aluminum oxide, zirconium oxide, zinc oxide, and the like. The diffusive particles may comprise or be formed of one material or a combination of two or more materials among these materials. It is especially preferable to use silicon oxide, which has a small coefficient of thermal expansion. As the diffusive particles, nanoparticles may be used. In this case, light emitted by the light emitting element is more scattered, which can reduce the amount of the wavelength conversion particles to be used. The "nanoparticles" are particles having a particle size of 1 nm or more and 100 nm or less. In this specification, the "particle size" is defined by, for example, $D_{50}$.

First Light Guide Member 40

The first light guide member secures the light emitting element and the light-transmissive member, and guides the light from the light emitting element to the light-transmissive member. A base material of the first light guide member may comprise or be formed of a silicone resin, an epoxy resin, a phenol resin, a polycarbonate resin, an acrylic resin or a modified resin thereof. As the material of the first light guide member, an epoxy resin is preferable because use of an epoxy resin can improve the hardness of the light emitting device than use of a silicone resin. A silicone resin and a modified resin thereof, which are highly resistant against heat and light, are also preferable as the material of the first light guide member. The first light guide member may contain wavelength conversion particles and/or diffusive particles same as, or similar to, those of the light-transmissive member described above.

Second Reflective Member 90

The second reflective member is formed between the electrodes formation surface of the light emitting element and the top surface of the base member, and alleviates absorption of the light from the light emitting element into the base member. The second reflective member may be formed a material same as, or similar to, that of the first reflective member.

Second Light Guide Member 41

The second light guide member directly covers the lateral surfaces of the light emitting element and the first reflective member 30, and allows the light from the light emitting element to expand in the X direction and/or the Y direction more easily. The second light guide member may comprise or be formed of a material same as, or similar to, that of the first light guide member described above. The second light guide member may contain wavelength conversion particles and/or diffusive particles same as, or similar to, those of the light-transmissive member described above.

Conductive Bonding Member 60

The conductive bonding member electrically connects the element electrodes of the light emitting element and the first wiring portions to each other. The conductive bonding member may be any one of: bumps mainly containing gold, silver, copper or the like; metal pastes containing metal powder of silver, gold, copper, platinum, aluminum, palladium or the like and a resin binder; solder based on tin-bismuth, tin-copper, tin-silver, gold-tin or the like; and a brazing material of a low melting-point metal material; and the like.

A light emitting device according to an embodiment of the present disclosure can be used for, for example, backlight devices of liquid crystal display devices; various lighting devices; large-scale displays; various display devices for advertisements, destination guides and the like; projector devices; and image reading devices for digital video cameras, facsimiles, copiers, scanners and the like.

While certain embodiments of the present invention has been described above, it will be apparent to those skilled in the art that the invention may be modified in numerous ways and may assume many embodiments other than those specifically described above. Accordingly, it is intended by the appended claims to cover all modifications of the invention that fall within the spirit and scope of the invention.

What is claimed is:

1. A method for producing a light emitting device, comprising the steps of:
    providing an intermediate body including:
        a precursor substrate including a base member that includes a top surface and a first bottom surface positioned opposite to the top surface, a plurality of pairs of first wiring portions located on the top surface, and a plurality of pairs of second wiring portions electrically connected with a plurality of pairs of first wiring portions respectively and positioned between the top surface and the first bottom surface;
        a plurality of light emitting elements located on the plurality of the pair of first wiring portions, respectively;
        a plurality of light guide members covering at least a portion of a lateral surface of the plurality of light emitting elements, respectively;
        a plurality of light-transmissive members located above the plurality of light emitting elements, respectively; and
        a reflective member covering the plurality of light emitting elements via the plurality of light guide members, the reflective member being in contact with the top surface of the base member, the plurality of light guide members, and lateral surfaces of the plurality of light-transmissive members;
    removing a part of the base member off the first bottom surface of the base member to thin the base member so that a second bottom surface of the base member is formed; and
    forming a plurality of pairs of external electrodes, to be electrically connected with the plurality of pairs of second wiring portions respectively, on the second bottom surface.

2. The method for producing a light emitting device of claim 1, wherein the part of the base member is removed by grinding.

3. The method for producing a light emitting device of claim 1, wherein the part of the base member is removed by grinding.

4. The method for producing a light emitting device of claim 1, wherein the part of the base member is removed by grinding.

5. The method for producing a light emitting device of claim 1, wherein the pair of external electrodes are formed by sputtering.

6. The method for producing a light emitting device of claim 1, wherein forming the pair of external electrodes on the second bottom surface includes:
- forming a metal layer continuously covering the pair of second wiring portions and the base member, and
- removing a part of the metal layer to form the pair of external electrodes.

7. The method for producing a light emitting device of claim 6, wherein laser light is caused to radiate toward the metal layer to remove the part of the metal layer.

8. The method for producing a light emitting device of claim 1, wherein in forming the second bottom surface of the base member, each of the pair of second wiring portions is partially removed.

9. The method for producing a light emitting device of claim 1, wherein a thickness from the top surface to the second bottom surface is at least 0.05 times and at most 0.6 times a thickness from the top surface to the first bottom surface.

10. The method for producing a light emitting device of claim 1, wherein a maximum thickness from the top surface to the first bottom surface is 100 μm or greater and 500 μm or less.

11. The method for producing a light emitting device of claim 1, wherein a maximum thickness from the top surface to the second bottom surface is 20 μm or greater and 60 μm or less.

12. The method for producing a light emitting device of claim 1, wherein in the step of providing an intermediate body, the reflective member is further in contact with bottom surfaces of the plurality of light emitting elements.

13. The method for producing a light emitting device of claim 1, further comprising, after the forming step, a step of cutting the reflective member and the base member at each position between the plurality of light emitting elements to provide a plurality of light emitting devices.

* * * * *